United States Patent
Chung et al.

(10) Patent No.: US 12,293,921 B2
(45) Date of Patent: *May 6, 2025

(54) METHODS OF CUTTING A FINE PATTERN, METHODS OF FORMING ACTIVE PATTERNS USING THE SAME, AND METHODS OF MANUFACTURING A SEMICONDUCTOR DEVICE USING THE SAME

(71) Applicant: SAMSUNG ELECTRONICS CO., LTD., Suwon-si (KR)

(72) Inventors: Sanggyo Chung, Anyang-si (KR); Jiseung Lee, Seoul (KR); Kyoungha Eom, Yongin-si (KR); Hyunchul Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/497,172

(22) Filed: Oct. 30, 2023

(65) Prior Publication Data

US 2024/0063024 A1 Feb. 22, 2024

Related U.S. Application Data

(63) Continuation of application No. 17/022,208, filed on Sep. 16, 2020, now Pat. No. 11,842,899.

(30) Foreign Application Priority Data

Jan. 9, 2020 (KR) .................. 10-2020-0002968

(51) Int. Cl.
*H01L 21/308* (2006.01)
*C23C 16/40* (2006.01)
(Continued)

(52) U.S. Cl.
CPC ........ *H01L 21/3088* (2013.01); *C23C 16/401* (2013.01); *C23C 16/45525* (2013.01);
(Continued)

(58) Field of Classification Search
CPC ............ H01L 21/3088; H01L 21/3065; H01L 21/3084; H01L 21/3085; H01L 21/3086;
(Continued)

(56) References Cited

U.S. PATENT DOCUMENTS 5,918,147 A  6/1999  Filipiak et al.
6,074,952 A *  6/2000  Liu .................. H10B 12/09
                                                                438/743
(Continued)

FOREIGN PATENT DOCUMENTS

KR  10-2017-0059363  5/2017
KR  10-2017-0132433  12/2017
KR  10-2018-0043784  4/2018

OTHER PUBLICATIONS

Office Action in Korean Appln. No. KR 10-2020-0002968, mailed on Aug. 22, 2024, 26 pages (with English translation).

*Primary Examiner* — Dale E Page
*Assistant Examiner* — Quovaunda Jefferson
(74) *Attorney, Agent, or Firm* — Fish & Richardson P.C.

(57) ABSTRACT

In a method of cutting a fine pattern, a line structure is formed on a substrate. The line structure extends in a first direction, and includes a pattern and a first mask. The pattern and the first mask include different materials. A sacrificial layer is formed on the substrate to cover the line structure. The sacrificial layer is partially etched to form a first opening partially overlapping the line structure in a vertical direction. A portion of the first mask, an upper portion of the pattern and/or a portion of the sacrificial layer under the first opening are partially etched using an etching gas having no
(Continued)

etching selectivity among the pattern, the first mask and the sacrificial layer. A lower portion of the pattern under the upper portion thereof is removed to divide the pattern into a plurality of pieces spaced apart from each other in the first direction.

15 Claims, 36 Drawing Sheets

(51) Int. Cl.
    *C23C 16/455*     (2006.01)
    *C23C 16/56*     (2006.01)
    *H01L 21/3065*     (2006.01)
    *H10B 12/00*     (2023.01)

(52) U.S. Cl.
    CPC .......... *C23C 16/56* (2013.01); *H01L 21/3065* (2013.01); *H01L 21/3081* (2013.01); *H01L 21/3085* (2013.01); *H01L 21/3086* (2013.01); *H10B 12/0335* (2023.02); *H10B 12/053* (2023.02); *H10B 12/315* (2023.02); *H10B 12/34* (2023.02); *H10B 12/482* (2023.02)

(58) Field of Classification Search
    CPC ......... H01L 21/31138; H01L 21/31144; H01L 21/31116; H01L 27/10814; H01L 27/10823; H01L 27/10855; H01L 27/10876; H01L 27/10885; C23C 16/401; C23C 16/45525; C23C 16/56
    See application file for complete search history.

(56) References Cited

U.S. PATENT DOCUMENTS

| | | | |
|---|---|---|---|
| 6,225,187 | B1 | 5/2001 | Huang et al. |
| 6,699,792 | B1 | 3/2004 | Wang et al. |
| 7,314,810 | B2 | 1/2008 | Jung |
| 7,429,536 | B2 | 9/2008 | Abatchev et al. |
| 8,592,327 | B2 | 11/2013 | Ranjan et al. |
| 8,617,996 | B1 | 12/2013 | Chi et al. |
| 8,753,940 | B1 | 6/2014 | Wei et al. |
| 9,607,985 | B1 | 3/2017 | Tseng et al. |
| 9,929,023 | B2 | 3/2018 | Do et al. |
| 10,297,555 | B2 | 5/2019 | Kuan et al. |
| 10,355,110 | B2 | 7/2019 | Chang et al. |
| 10,460,963 | B2 | 10/2019 | Ogawa et al. |
| 11,842,899 | B2 * | 12/2023 | Chung ................. H10B 12/315 |
| 2013/0309838 | A1 | 11/2013 | Wei et al. |
| 2018/0090607 | A1 | 3/2018 | Lin et al. |
| 2018/0226403 | A1 | 8/2018 | Chen et al. |
| 2018/0337251 | A1 | 11/2018 | Chang et al. |

* cited by examiner

METHODS OF CUTTING A FINE PATTERN, METHODS OF FORMING ACTIVE PATTERNS USING THE SAME, AND METHODS OF MANUFACTURING A SEMICONDUCTOR DEVICE USING THE SAME

CROSS-REFERENCE TO RELATED APPLICATION

This is application is a continuation of U.S. application Ser. No. 17/022,208, filed Sep. 16, 2020, which claims priority under 35 U.S.C. § 119 to Korean Patent Application No. 10-2020-0002968, filed on Jan. 9, 2020, in the Korean Intellectual Property Office, the disclosures of each are hereby incorporated by reference in their entireties.

TECHNICAL FIELD

Example embodiments of the present disclosure relate to a method of cutting a fine pattern, a method of forming active patterns using the same, and a method of manufacturing a semiconductor device using the same.

DISCUSSION OF RELATED ART

A line pattern may be formed, and may be cut to form fine patterns spaced apart from each other. In order to form the fine patterns, a photoresist pattern may be formed on a mask layer on the line pattern to have a first opening exposing an upper surface of the mask layer, a spacer may be formed on a sidewall of the first opening, and the mask layer may be etched using the photoresist pattern and the spacer as an etching mask to form a mask having a second opening. The line pattern may be etched using the mask as an etching mask to form the fine patterns. If the photoresist pattern is easily removed during the etching process, a slope of a sidewall of the second opening may be lowered, and a width of the second opening may be enlarged, which may cause a decrease of process margin.

SUMMARY

Example embodiments provide a method of cutting a fine pattern having improved characteristics.

Example embodiments provide a method of forming active patterns having improved characteristics.

Example embodiments provide a method of manufacturing a semiconductor device having improved characteristics.

According to example embodiments of the inventive concepts, there is a method of cutting a fine pattern. In the method, a line structure may be formed on a substrate. The line structure may extend in a first direction parallel to an upper surface of the substrate and include a pattern and a first mask sequentially stacked, and the pattern and the first mask may include different materials from each other. A sacrificial layer may be formed on the substrate to cover the line structure. The sacrificial layer may be partially etched to form a first opening partially overlapping the line structure in a vertical direction perpendicular to the upper surface of the substrate. At least one of a portion of the first mask, an upper portion of the pattern, and a portion of the sacrificial layer that are under the first opening may be partially etched using a first etching gas, the first etching gas having no etching selectivity among the pattern, the first mask, and the sacrificial layer. A lower portion of the pattern under the upper portion thereof may be removed to divide the pattern into a plurality of pieces spaced apart from each other in the first direction.

According to example embodiments of the inventive concepts, there is a method of cutting a fine pattern. In the method, a line structure may be formed on a substrate. The line structure may extend in a first direction parallel to an upper surface of the substrate. A sacrificial layer may be formed on the substrate to cover the line structure. A first mask layer and a photoresist pattern may be sequentially formed on the sacrificial layer. The first mask layer may include silicon oxynitride, and the photoresist pattern may include a first opening exposing an upper surface of the first mask layer. The first mask layer may be etched by an etching process using the photoresist pattern as an etching mask to form a first mask having a second opening exposing an upper surface of the sacrificial layer. The etching process may be performed using a first etching gas including $SF_6$ gas and $CHF_3$ gas so that carbon-sulfur (C—S) bonds may be formed on a surface of the photoresist pattern to restrain etching of the photoresist pattern, and a slope of the second opening may have an angle equal to or greater than 80 degrees with respect to the upper surface of the substrate. The sacrificial layer may be partially etched using the first mask as an etching mask to form a third opening exposing a portion of the line structure. The portion of the line structure exposed by the third opening may be removed to divide the line structure into a plurality of pieces spaced apart from each other in the first direction.

According to example embodiments of the inventive concepts, there is a method of forming active patterns. In the method, a line structure may be formed on a substrate. The line structure may extend in a first direction parallel to an upper surface of the substrate and include a first pattern and a first mask sequentially stacked, and the first pattern and the first mask may include different materials from each other. A sacrificial layer may be formed on the substrate to cover the line structure. The sacrificial layer may be partially etched to form a first opening partially overlapping the line structure in a vertical direction perpendicular to the upper surface of the substrate. At least one of a portion of the first mask, an upper portion of the first pattern, and a portion of the sacrificial layer that are under the first opening may be etched using a first etching gas to form a second opening, the first etching gas having no etching selectivity among the first pattern, the first mask, and the sacrificial layer. A lower portion of the first pattern under the upper portion thereof may be removed to divide the first pattern into a plurality of pieces spaced apart from each other in the first direction. An upper portion of the substrate may be etched using the plurality of first patterns as an etching mask to form a plurality of active patterns spaced apart from each other in the first direction.

According to example embodiments of the inventive concepts, there is a method of forming active patterns. In the method, a line structure may be formed on a substrate. The line structure may extend in a first direction parallel to an upper surface of the substrate. A sacrificial layer may be formed on the substrate to cover the line structure. A first mask layer and a photoresist pattern may be sequentially formed on the sacrificial layer. The first mask layer may include silicon oxynitride, and the photoresist pattern may include a first opening exposing an upper surface of the first mask layer. The first mask layer may be etched by an etching process using the photoresist pattern as an etching mask to form a first mask having a second opening exposing an upper surface of the sacrificial layer. The etching process may be performed using a first etching gas including $SF_6$ gas and $CHF_3$ gas so that carbon-sulfur (C—S) bonds may be formed on a surface of the photoresist pattern to restrain etching of the photoresist pattern. A slope of the second opening may have an angle equal to or greater than 80 degrees with respect to the upper surface of the substrate. The sacrificial layer may be partially etched using the first mask as an etching mask to form a third opening exposing a portion of the line structure. The portion of the line structure exposed by the third opening may be removed to divide the line structure into a plurality of pieces spaced apart from each other in the first direction. An upper portion of the substrate may be etched using the plurality of line structures as an etching mask to form a plurality of active patterns spaced apart from each other in the first direction.

According to example embodiments of the inventive concepts, there is a method of manufacturing a semiconductor device. In the method, a line structure may be formed on a substrate. The line structure may extend in a first direction parallel to an upper surface of the substrate and include a pattern and a mask sequentially stacked, and the pattern and the mask may include different materials from each other. A sacrificial layer may be formed on the substrate to cover the line structure. The sacrificial layer may be partially etched to form a first opening partially overlapping the line structure in a vertical direction perpendicular to the upper surface of the substrate. At least one of a portion of the mask, an upper portion of the pattern, and a portion of the sacrificial layer that are under the first opening may be etched using an etching gas to form a second opening, the etching gas having no etching selectivity among the pattern, the mask, and the sacrificial layer. A lower portion of the pattern under the upper portion thereof may be removed to divide the pattern into a plurality of pieces spaced apart from each other in the first direction. An upper portion of the substrate may be etched using the plurality of patterns as an etching mask to form a plurality of active patterns spaced apart from each other in the first direction. A gate structure may be formed to be buried at upper portions of the plurality of active patterns. A bit line structure may be formed on the plurality of active patterns to be electrically connected thereto. A capacitor may be formed on the plurality of active patterns to be electrically connected thereto.

According to example embodiments of the inventive concepts, there is a method of manufacturing a semiconductor device. In the method, a line structure may be formed on a substrate. The line structure may extend in a first direction parallel to an upper surface of the substrate. A sacrificial layer may be formed on the substrate to cover the line structure. A mask layer and a photoresist pattern may be sequentially formed on the sacrificial layer. The mask layer may include silicon oxynitride, and the photoresist pattern may include a first opening exposing an upper surface of the mask layer. The mask layer may be etched by an etching process using the photoresist pattern as an etching mask to form a mask having a second opening exposing an upper surface of the sacrificial layer. The etching process may be performed using an etching gas including $SF_6$ gas and $CHF_3$ gas so that carbon-sulfur (C—S) bonds may be formed on a surface of the photoresist pattern to restrain etching of the photoresist pattern. A slope of the second opening may have an angle equal to or greater than 80 degrees with respect to the upper surface of the substrate. The sacrificial layer may be partially etched using the mask as an etching mask to form a third opening exposing a portion of the line structure. The portion of the line structure exposed by the third opening may be removed to divide the line structure into a plurality of pieces spaced apart from each other in the first direction. An upper portion of the substrate may be etched using the plurality of line structures as an etching mask to form a plurality of active patterns spaced apart from each other in the first direction. A gate structure may be formed to be buried at upper portions of the plurality of active patterns. A bit line structure may be formed on the plurality of active patterns to be electrically connected thereto. A capacitor may be formed on the plurality of active patterns to be electrically connected thereto.

In the method of cutting the fine pattern in accordance with example embodiments, when the second mask layer is etched using the photoresist pattern as an etching mask to form the second mask, the etching gas including $SF_6$ gas may be used to restrain the loss of the photoresist pattern and etch the second mask layer at a high rate. Thus, the sacrificial layer covering the patterns under the second mask may have a small thickness.

The sacrificial layer may be etched until or just before the upper surface of the first mask on each of the patterns is exposed, and the first mask and a corresponding one of the patterns may be etched using an etching gas having no or less etching selectivity among the patterns, the first mask and the sacrificial layer, so that no etching byproducts may be formed. Accordingly, the failure in which the patterns are not removed may be reduced.

BRIEF DESCRIPTION OF THE DRAWINGS

Exemplary embodiments of the inventive concept will be more clearly understood from the following detailed description taken in conjunction with the accompanying drawings in which like numbers refer to like elements throughout. In the drawings.

DETAILED DESCRIPTION

The above and other aspects and features of a method of cutting a fine pattern, a method of forming active patterns using the same, and a method of manufacturing a semiconductor device using the same in accordance with example embodiments will become readily understood from detail descriptions that follow, with reference to the accompanying drawings. It will be understood that, although the terms "first," "second," and/or "third" may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer or section discussed below could be termed a second or third element, component, region, layer, or section without departing from the teachings of inventive concepts.

FIGS. 1 to 14 are plan views and cross-sectional views illustrating a method of forming active patterns according to example embodiments. Specifically, FIGS. 1, 3A-3B, and 10 are the plan views, and FIGS. 2, 4-9 and 11-14 are cross-sectional views taken along lines A-A' of corresponding plan views, respectively.

Hereinafter in the specifications (not necessarily in the claims), two directions substantially parallel to an upper surface of a substrate and substantially perpendicular to each other may be defined as first and second directions, respectively, a direction substantially parallel to an upper surface of the substrate and having an acute angle with each of the second and third directions may be defined as a third direction, and a direction substantially parallel to the upper surface of the substrate and substantially perpendicular to the third direction may be defined as a fourth direction.

Figure 1:
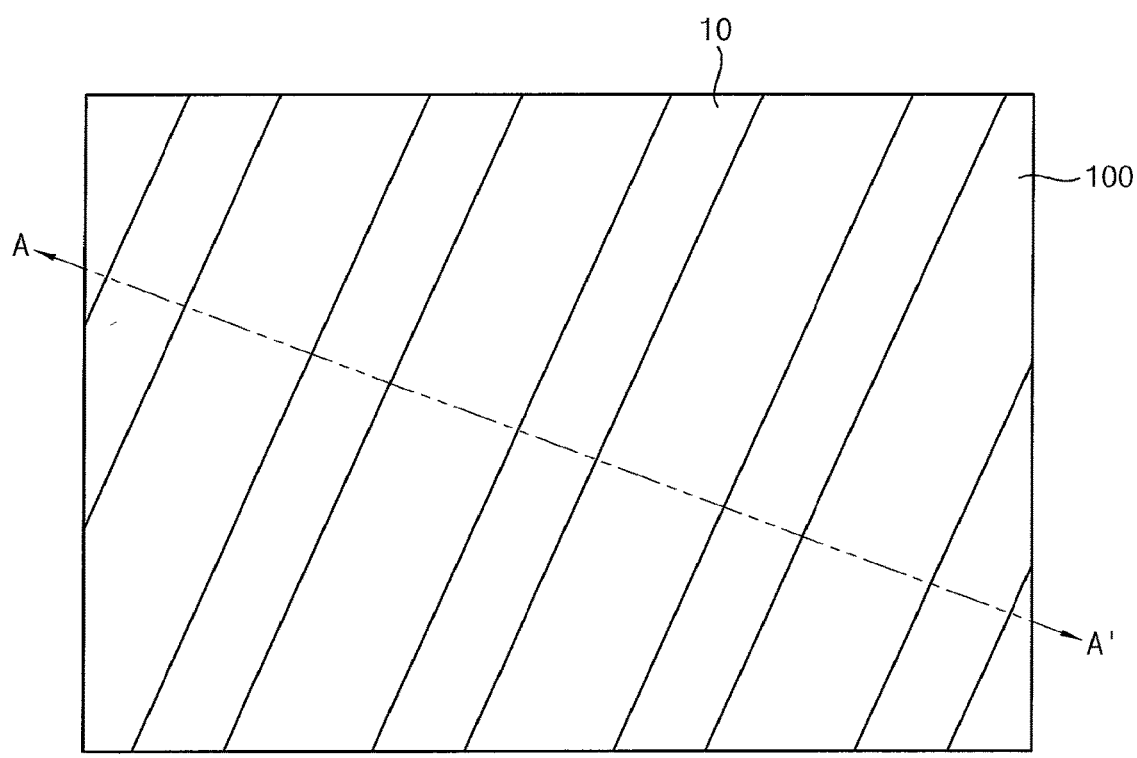
FIGS. 1, 2, 3A-3B, and 4 to 14 are plan views and cross-sectional views illustrating a method of forming active patterns, according to example embodiments.
Figure 1:
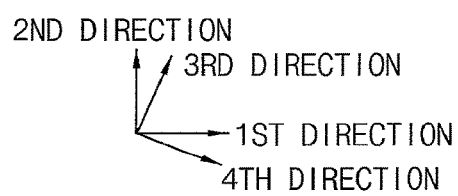
Figure 2:
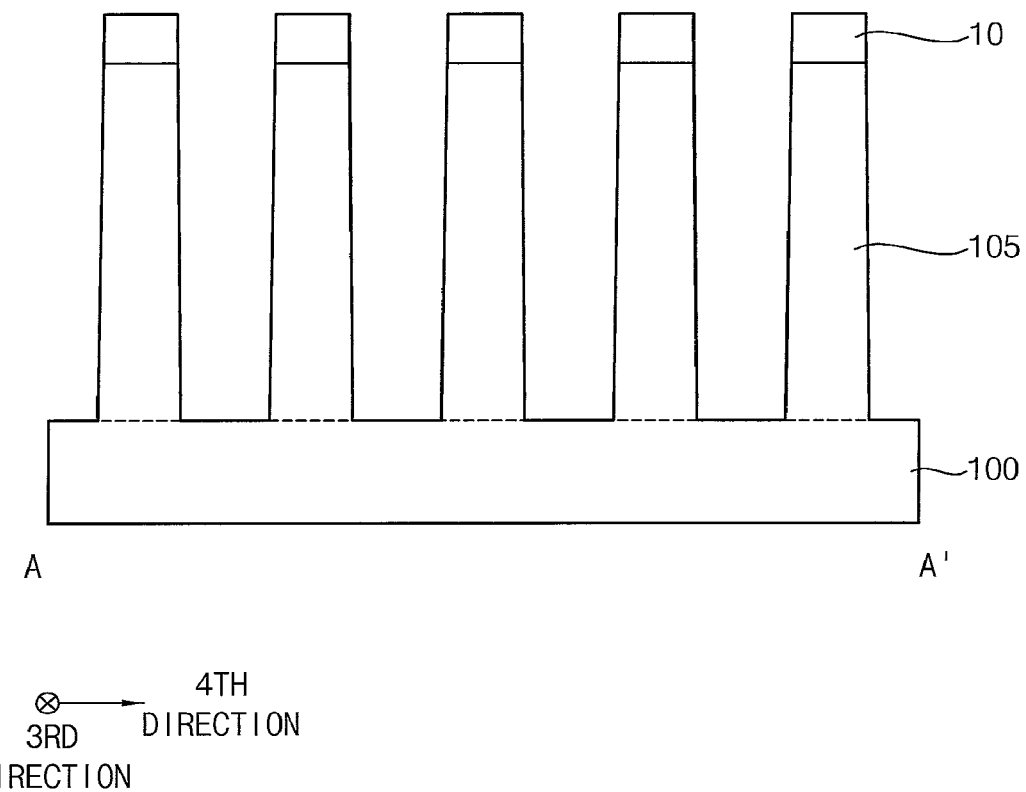

Referring to FIGS. 1 and 2, a first mask 10 may be formed on a substrate 100, and an upper portion of the substrate 100 may be etched using the first mask 10 as an etching mask to form an active pattern 105 on the substrate 100.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The first mask 10 may include an oxide, e.g., silicon oxide, and may be formed by, e.g., an atomic layer deposition (ALD) process.

In example embodiments, the active pattern 105 may be formed by dual patterning technology (DPT) or quadruple patterning technology (QPT).

In example embodiments, a line structure including the active pattern 105 and the first mask 10 sequentially stacked may extend lengthwise in the third direction, and a plurality of line structures may be spaced apart from each other in the fourth direction.

Figure 3A:
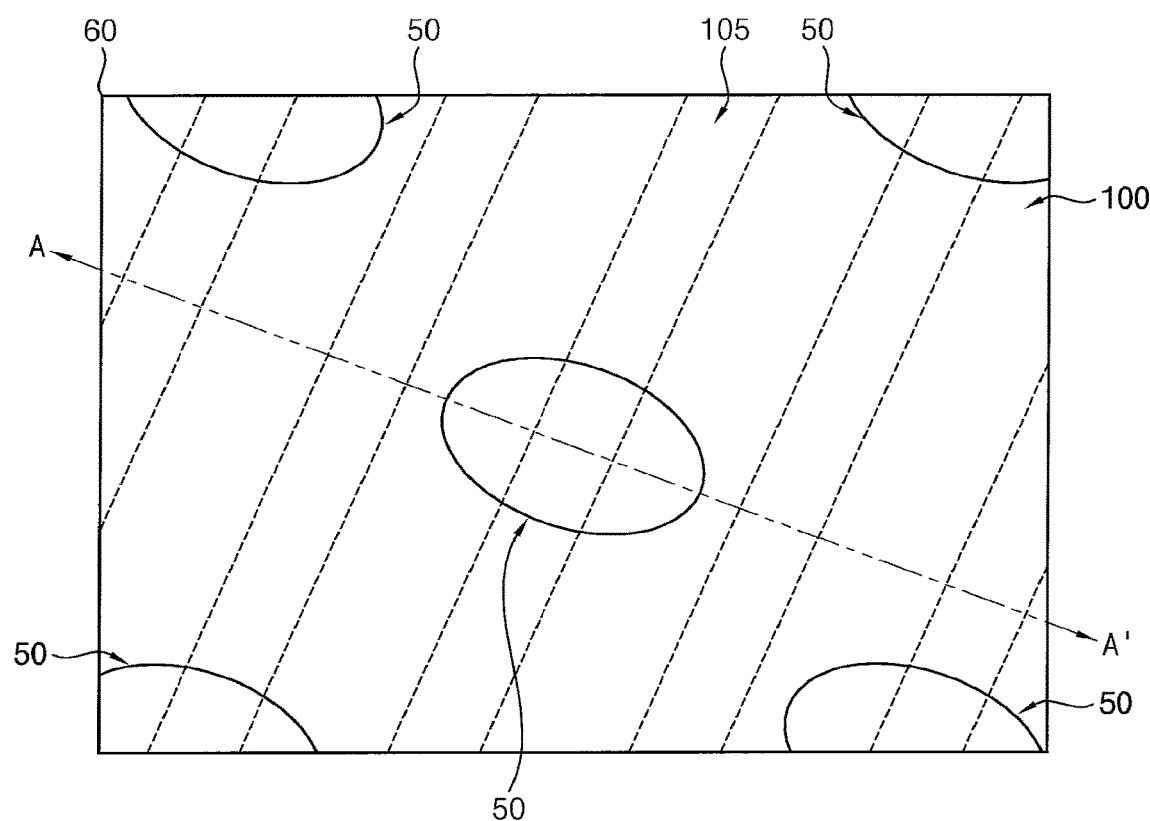
Figure 3A:
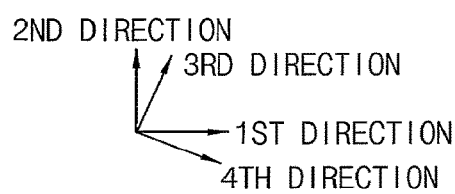
Figure 4:
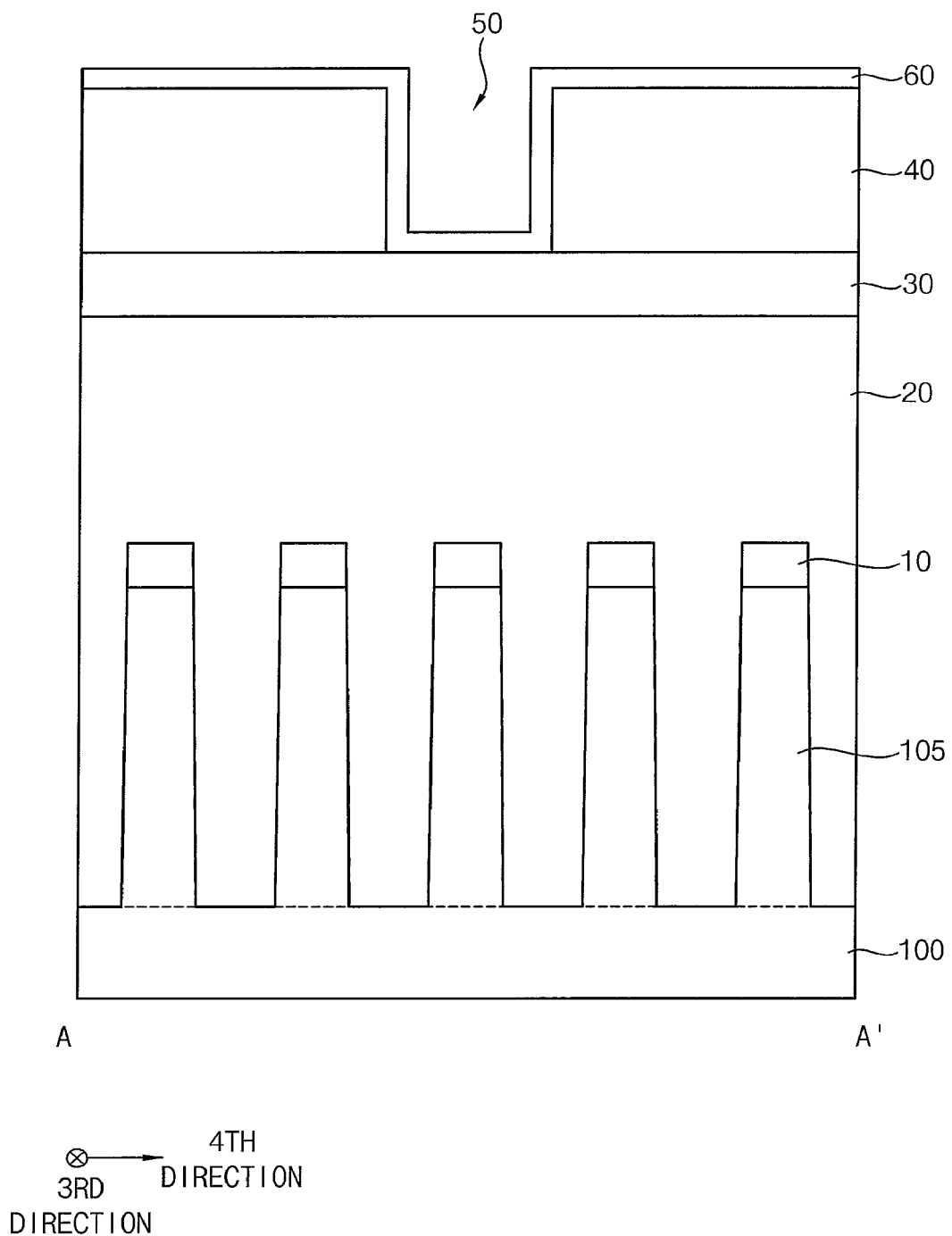

Referring to FIGS. 3A and 4, a first sacrificial layer 20 may be formed on the substrate 100 to cover the line structures, a second mask layer 30 may be formed on the first sacrificial layer 20, a photoresist pattern 40 having a first opening 50 exposing an upper surface of the second mask layer 30 may be formed on the second mask layer 30, and a first spacer layer 60 may be formed on the exposed upper surface of the second mask layer 30, a sidewall of the first opening 50 and an upper surface of the photoresist pattern 40. In the example of FIG. 3A, in a plan view, the first opening 50 may have an elliptical shape having a long axis parallel to the fourth direction and a short axis parallel to the third direction.

In some embodiments, a bottom anti-reflective coating (BARC) layer may be further formed between the second mask layer 30 and the photoresist pattern 40.

The first sacrificial layer 20 may include, e.g., spin-on-hardmask (SOH), and the second mask layer 30 may include an oxynitride, e.g., plasma enhanced silicon oxynitride (PE-SiON). However, the inventive concept may not be limited thereto, and the first sacrificial layer 20 and the second mask layer 30 may include other materials having etching selectivity with respect to each other.

The first sacrificial layer 20 may have a thickness of about 800 Å to about 3,000 Å in a vertical direction substantially perpendicular to the upper surface of the substrate 100, and the second mask layer 30 may have a thickness of about 50 Å to about 600 Å in the vertical direction.

The first spacer layer 60 may be formed by, e.g., an ALD process, and may include an oxide, e.g., silicon oxide.

In example embodiments, a plurality of first openings 50 may be formed to be spaced apart from each other in the third direction on each of the line structures extending lengthwise in the third direction. Each of the first opening 50 may partially overlap a corresponding one of the line structures in the vertical direction, and a width in the fourth direction of each of the first opening 50 may be greater than a width in the fourth direction of the corresponding one of the line structures. For example, a width of the first opening 50 along the long axis may be greater than the width of the underlying line structure.

Figure 3B:
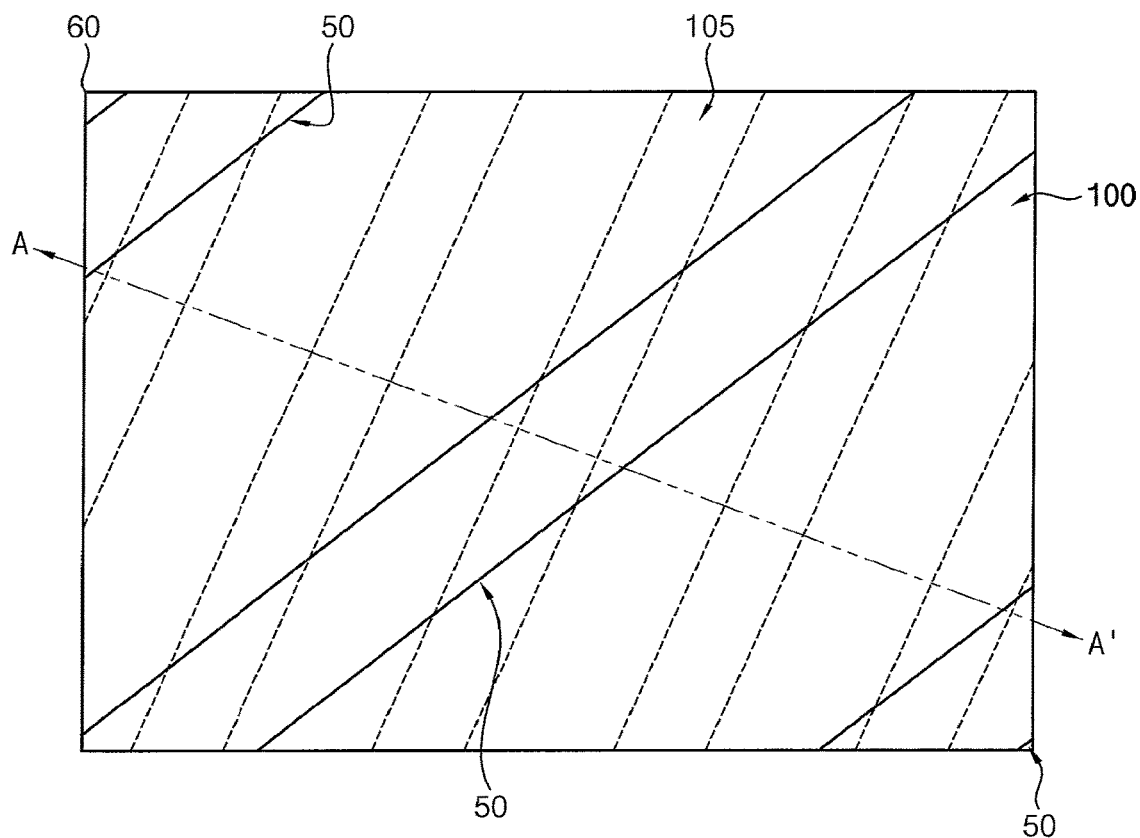
Figure 3B:
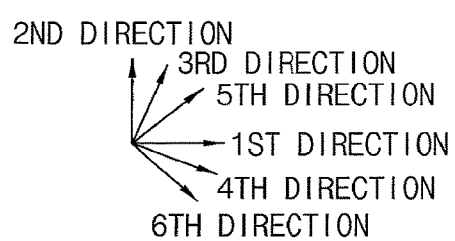

Alternatively, referring to FIG. 3B, the first opening 50 may extend lengthwise in a fifth direction substantially parallel to the upper surface of the substrate 100 and having an acute angle with the third direction, and a plurality of first openings 50 may be formed to be spaced apart from each other in a sixth direction substantially parallel to the upper surface of the substrate 100 and substantially perpendicular to the fifth direction. For example, in the embodiment of FIG. 3A, the first opening 50 may have line or bar shape in a plan view. Hereinafter, only the first openings 50 spaced apart from each other in the third direction on each of the line structures shown in FIG. 3A will be described.

Figure 5:
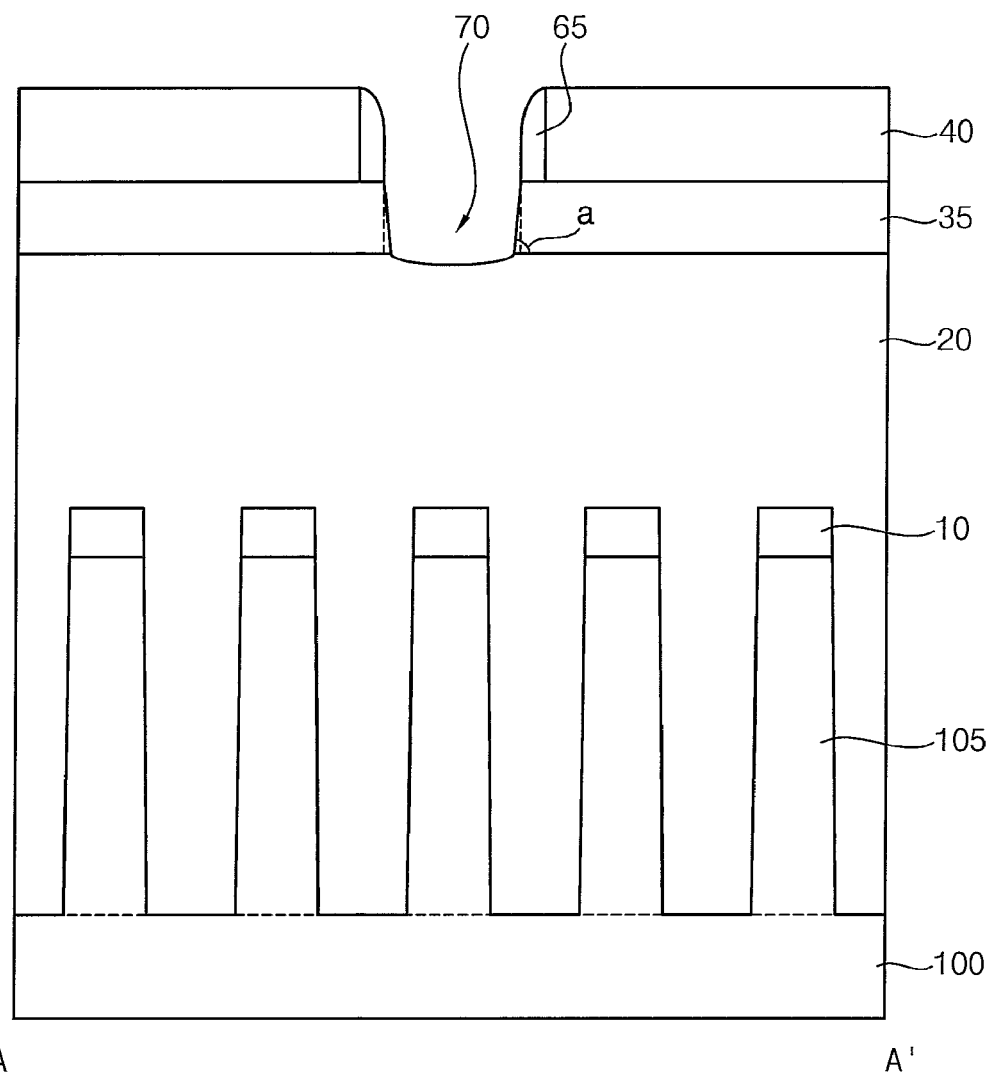

Referring to FIG. 5, the first spacer layer 60 may be anisotropically etched to remove portions of the first spacer layer 60 on the upper surface of the second mask layer 30 and the upper surface of the photoresist pattern 40, and thus a first spacer 65 may be formed on the sidewall of the first opening 50. Additionally, an etching process may be performed using the photoresist pattern 40 and the first spacer 65 as an etching mask to form a second opening 70 extending through the second mask layer 30 to expose an upper surface of the first sacrificial layer 20.

The anisotropic etching process for the first spacer layer 60 and the etching process for the second mask layer 30 may be performed in-situ, and thus may be continuously performed.

In example embodiments, the etching process may be performed using an etching gas including $SF_6$ gas and $CHF_3$ gas. The $SF_6$ gas may be provided with a flow rate of about 3 sccm to about 50 sccm, and the $CHF_3$ gas may be provided with a flow rate of about 50 sccm to about 300 sccm. The etching process may be performed under a pressure of about 2 mT to about 50 mT, with a source power of about 200 W to about 1,000 W, and a bias power of about 10 W to about 500 W.

As the etching gas includes $SF_6$ gas containing sulfur (S), carbon-sulfur (C—S) bonds may be generated on a surface of the photoresist pattern 40 during the etching process, and thus the etching of the photoresist pattern 40 may be restrained. For example, when the etching gas includes $SF_6$ gas containing sulfur (S), the etching of the photoresist pattern 40 may be restricted or limited. Accordingly, an edge portion of the second mask layer 30 under the photoresist pattern 40 may not be removed due to the removal of the photoresist pattern 40 during the etching process.

As the etching gas includes $SF_6$ gas containing rich fluorine (F) together with the $CHF_3$ gas, the second mask layer 30 including PE-SiON may be etched at a high rate so that a sidewall of the second opening 70 may have an almost vertical sidewall with respect to the upper surface of the substrate 100. In example embodiments, the sidewall of the second opening 70 may have an angle a of about 80° to about 105° with respect to the upper surface of the substrate 100.

For example the etching gas used in the etching process may have a high etching selectivity between the second mask layer 30 and the photoresist pattern 40, and thus the etching process may be completed within a short time and an edge portion of the second mask layer 30 adjacent to the second opening 70 may be prevented from being etched, so that the second opening 70 extending through the second mask layer 30 may have a small width.

As the second opening 70 is formed, the second mask layer 30 may be transformed into a second mask 35.

Figure 6:
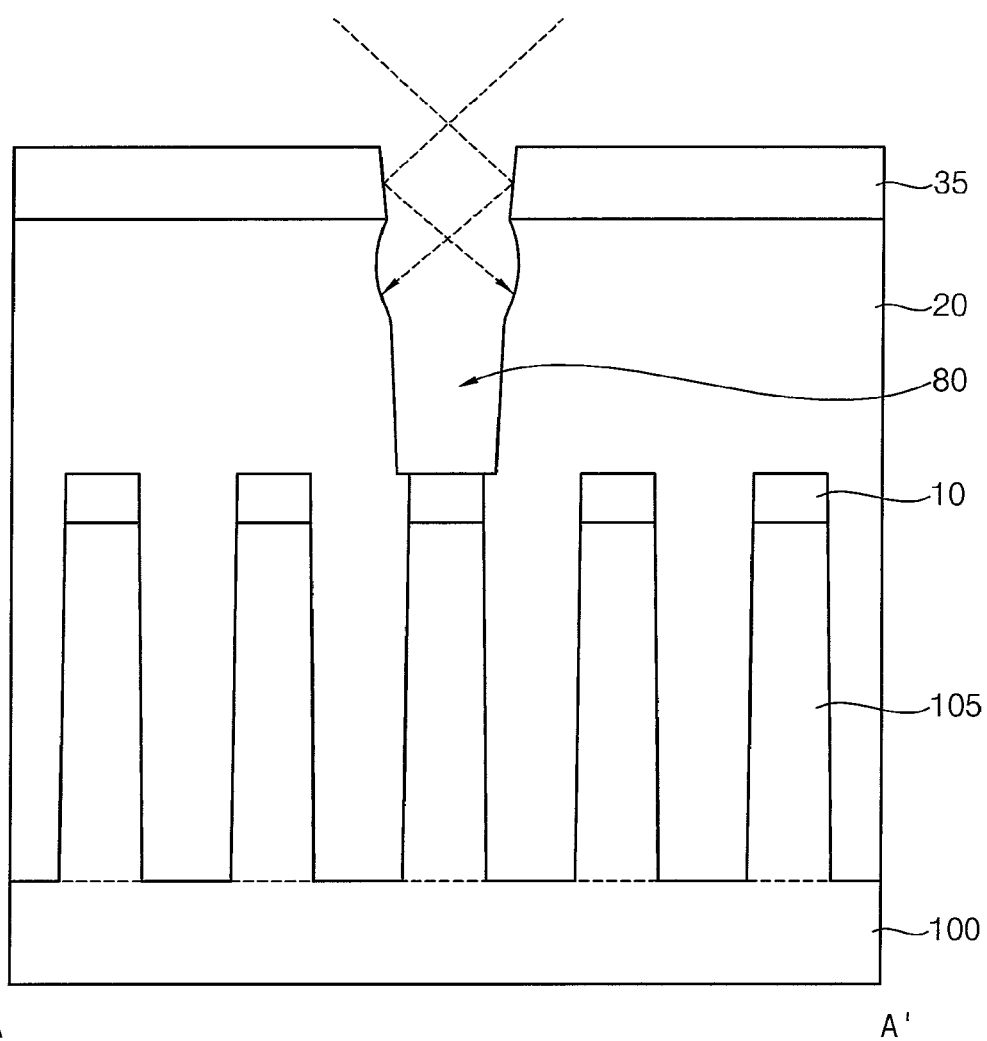

Referring to FIG. 6, a portion of the first sacrificial layer 20 exposed by the second opening 70 may be etched using the second mask 35 as an etching mask to form a third opening 80, and the etching process may be performed until an upper surface of the first mask 10 is exposed or just before the upper surface of the first mask 10 is exposed.

In example embodiments, the etching process may be performed using an etching gas including a gas having an etching selectivity between the second mask 35 including PE-SiON and the first sacrificial layer 20 including SOH, which may include oxygen gas and argon gas, and the etching gas may further include nitrogen gas and hydrogen bromide (HBr) gas.

During the etching process, the remaining photoresist pattern 40 and the first spacer 65 may be removed, and an upper portion of the second mask 35 may be partially removed.

In example embodiments, the third opening 80 may have a width that is constant or gradually decreases from a top toward a bottom thereof, however, an upper portion of the third opening 80 may have a width that gradually increases from a top toward a bottom thereof. For example, the sidewall of the third opening 80 may have an almost vertical slope, however, an upper portion of the sidewall thereof may have a varying slope, and an upper portion of the third opening 80 may have a width greater than those of other portions of the third opening 80, which may have a convex shape in a horizontal direction substantially parallel to the upper surface of the substrate 100 (due to a bowing phenomenon). This is because a sidewall of the second opening 70, that is, a sidewall of the second mask 35 exposed by the second opening 70, may not be completely vertical but may be slanted with respect to the upper surface of the substrate 100, and thus the etching gas may be reflected obliquely on the sidewall of the second mask 35 to etch an upper portion of the first sacrificial layer 20 during the etching process.

However, in example embodiments, the sidewall of the second opening 70 may be almost vertical with respect to the upper surface of the substrate 100, and thus the bowing phenomenon may not be severe. If the bowing phenomenon is severe around the upper portion of the third opening 80, the first sacrificial layer 20 has to have a sufficiently large thickness in order that the third opening 80 may have a sufficiently small width to correspond to only one of the active patterns 105. However, the bowing phenomenon is not severe in the third opening 80 in accordance with example embodiments, and thus the first sacrificial layer 20 may have a small thickness in the vertical direction. Accordingly, the first sacrificial layer 20 may have a thickness of about 200 Å to about 800 Å from an upper surface of the first mask 10.

The second mask 35 serving as an etching mask for etching the first sacrificial layer 20 may also have a small thickness in the vertical direction. Thus, the second mask 35 may have a thickness of about 50 Å to about 300 Å. As the second mask 35 may have a small thickness, the etching process for etching the second mask layer 30 illustrated with reference to FIG. 5 may be performed for a short time, and thus the second opening 70 extending through the second mask layer 30 and having a slanted sidewall may have a small width.

Figure 7:
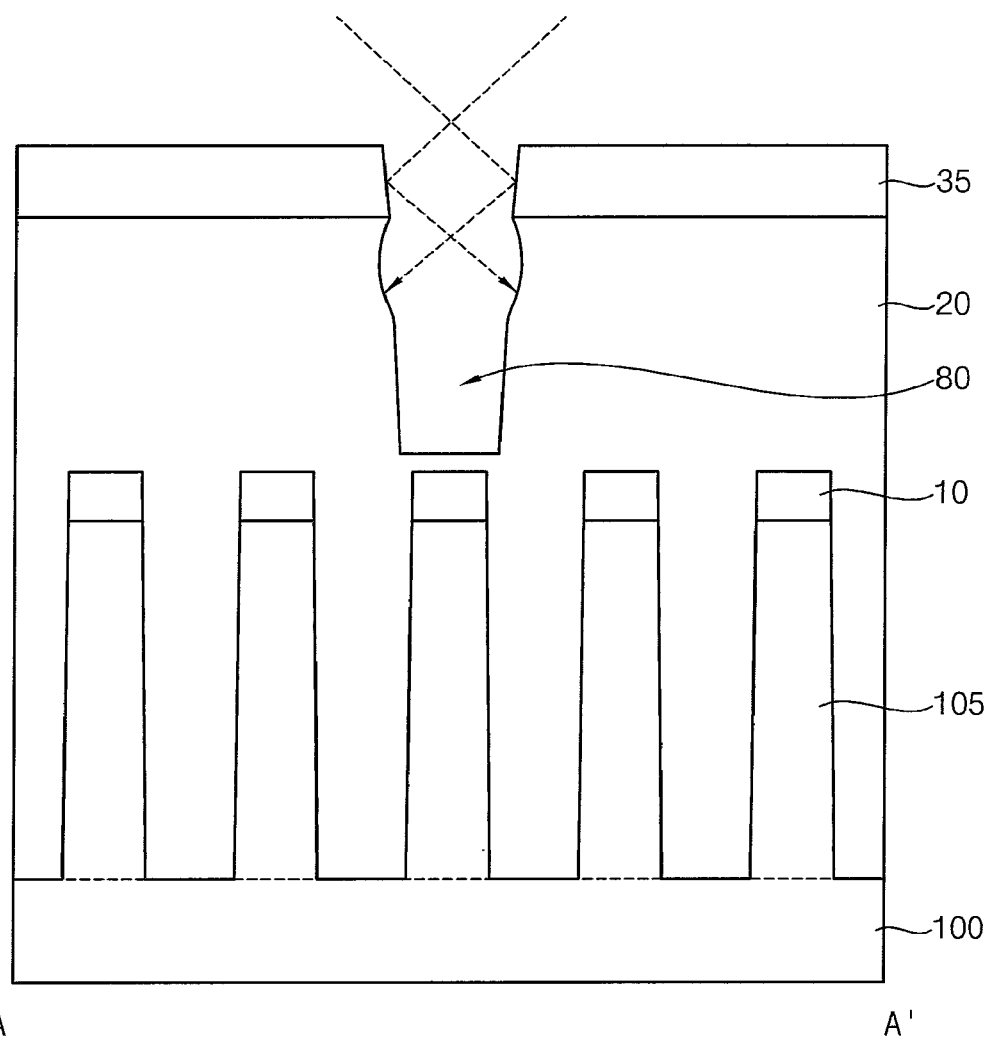

Referring to FIG. 7, the etching process may be performed until just before the upper surface of the first mask 10 is exposed, and thus the third opening 80 may not expose the upper surface of the first mask 10. However, even in this case, the third opening 80 may overlap a portion of the first mask 10 in the vertical direction.

Figure 8:
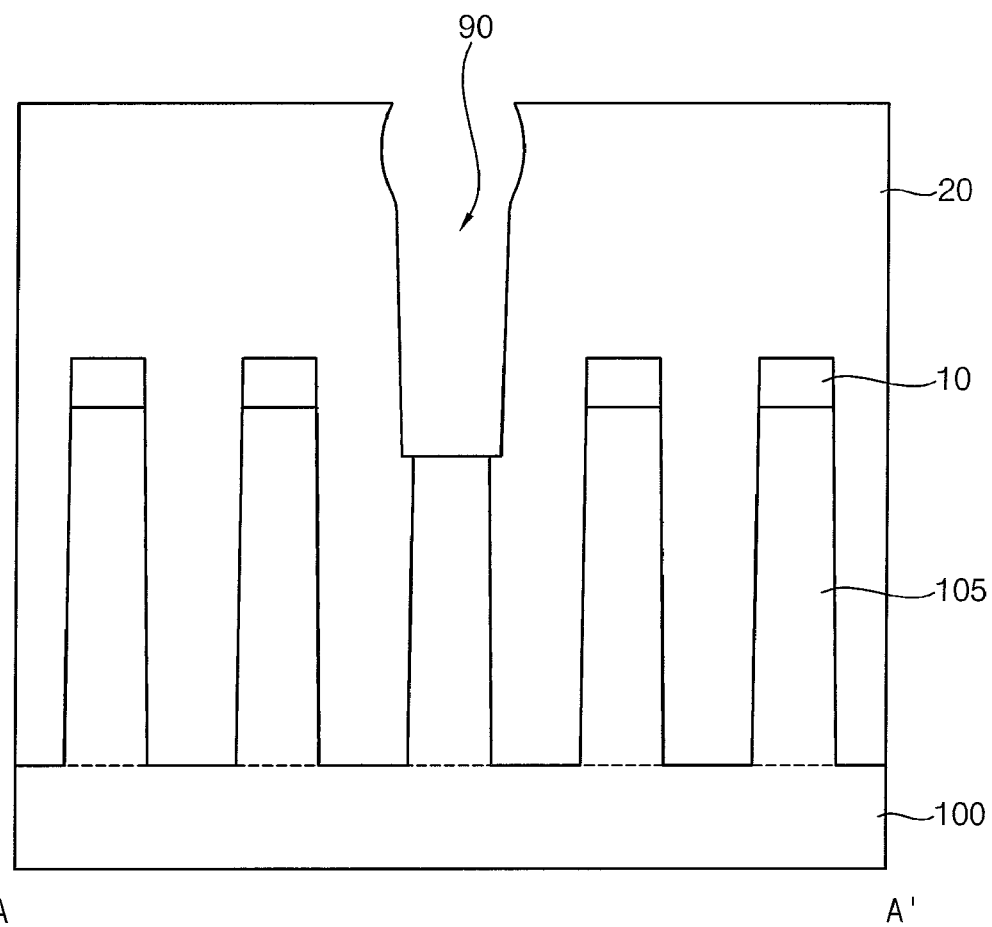

Referring to FIG. 8, a portion of the first mask 10 exposed by the third opening 80 and an upper portion of the active pattern 105 thereunder may be etched to form a fourth opening 90.

If the etching process for the first sacrificial layer 20 is performed until just before the upper surface of the first mask 10 is exposed (see, e.g., FIG. 7), a portion of the first sacrificial layer 20 on the first mask 10 that may overlap the third opening 80 in the vertical direction may be also etched during the etching process.

In example embodiments, the etching process may be performed using an etching gas having no or little etching selectivity among the first mask 10 including silicon oxide, the active pattern 105 including silicon, and the first sacrificial layer 20 including SOH. The etching gas may include, e.g., $CF_4$ gas and $CHF_3$ gas.

If the etching process for etching the first sacrificial layer 20 including SOH, which is illustrated with reference to FIGS. 6 and 7, is performed using the etching gas including oxygen gas and argon gas even when the first mask 10 and the active pattern 105 are exposed, the first mask 10 and an upper portion of the active pattern 105 may be sputtered by the etching gas to be reacted with the first sacrificial layer 20, and thus an etching byproduct including, e.g., silicon oxycarbide (SiOC) may be formed, which may be deposited on a bottom and a sidewall of the fourth opening 90. Accordingly, the fourth opening 90 may not keep its shape on the active pattern 105.

However, in example embodiments, the etching process may be performed using an etching gas having no or little etching selectivity among the first mask 10, the active pattern 105 and the first sacrificial layer 20, and thus no etching byproduct may be formed.

The second mask 35 may be removed during the etching process.

Figure 9:
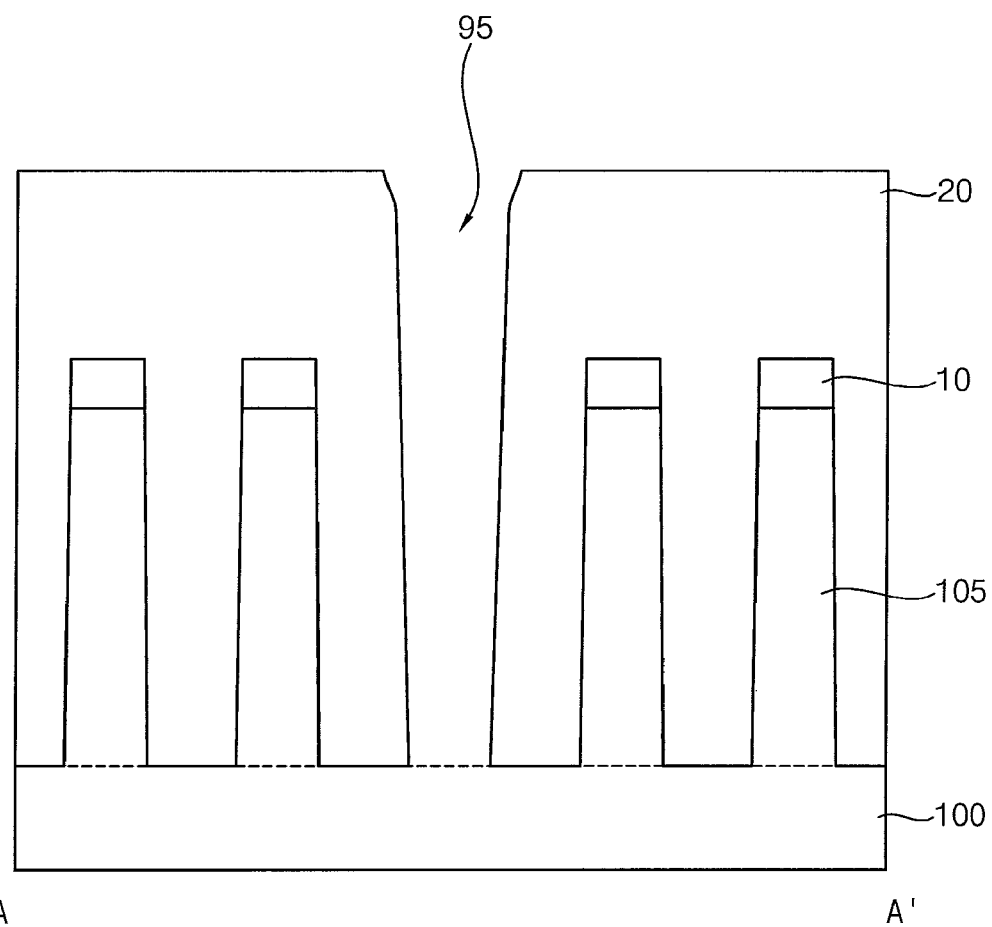

Referring to FIG. 9, a remaining portion of the active pattern 105 exposed by the fourth opening 90 may be removed to form a fifth opening 95 exposing an upper surface of the substrate 100.

Thus, each of the active patterns 105 extending in the third direction may be partially removed to be divided into a plurality of pieces spaced apart from each other in the third direction.

The etching process may be performed using an etching gas including, e.g., chlorine ($Cl_2$) gas and hydrogen bromide (HBr) gas.

Figure 10:
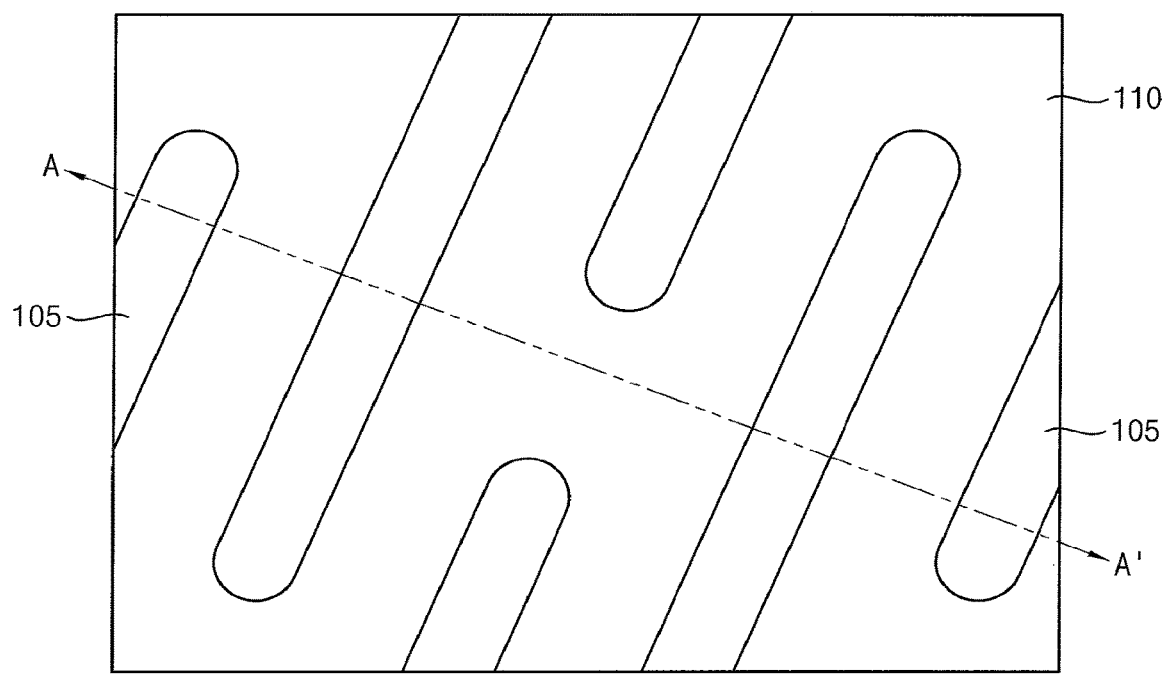
Figure 10:
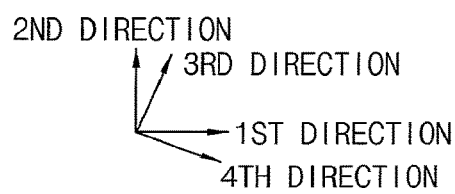
Figure 11:
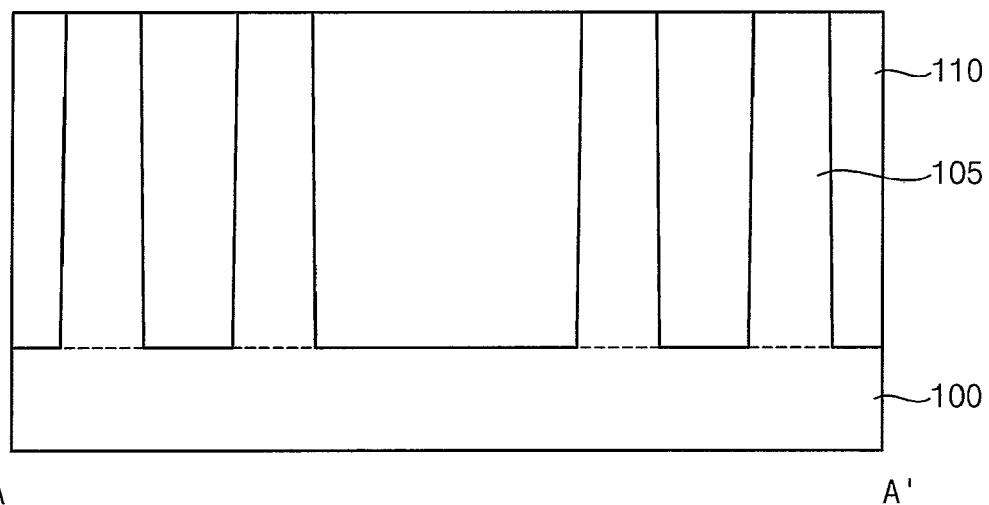

Referring to FIGS. 10 and 11, after removing the first sacrificial layer 20, an isolation layer may be formed on the substrate 100 to cover the active patterns 105, and may be planarized until upper surfaces of the active patterns 105 are exposed to form an isolation pattern 110.

The first sacrificial layer 20 may be removed by, e.g., an ashing process and/or a stripping process.

The isolation layer may include an oxide, e.g., silicon oxide, and the planarization process may be performed by, e.g., a chemical mechanical polishing (CMP) process and/or an etch back process.

By the above processes, the active patterns 105, each extending lengthwise in the third direction, may be spaced apart from each other in the fourth direction, and each of the active patterns 105 may be partially removed to be divided into a plurality of pieces spaced apart from each other in the fourth direction.

As illustrated above, when the second mask layer 30 is etched using the photoresist pattern 40 and the first spacer 65 as an etching mask to form the second mask 35, the etching gas including $SF_6$ gas containing sulfur (S) and rich fluorine (F) may be used. Thus, carbon-sulfur (C—S) bonds may be formed on the surface of the photoresist pattern 40 to restrain loss of the photoresist pattern 40 during the etching process, and the second mask layer 30 may be etched at a high rate. Accordingly, the sidewall of the second opening 70 extending through the second mask layer 30 may be almost vertical, and the second opening 70 may have a small width in the horizontal direction.

When the etching process for etching the first sacrificial layer 20 is performed using the second mask 35 as an etching mask, as the sidewall of the second mask 35 may be almost vertical, the bowing phenomenon of the third opening 80 in the first sacrificial layer 20 may be reduced. Thus, the third opening 80 may have a small width corresponding to one active pattern 105 even though the first sacrificial layer 20 does not have a large thickness in the vertical direction, and the second mask layer 30 serving as an etching mask for the first sacrificial layer 20 may also have a small thickness in the vertical direction. As a result, the second opening 70 extending through the second mask layer 30 and having a sidewall that has a constant slope may have a small width, so that the process margin for the distance between the active patterns 105 may increase.

Further, the first sacrificial layer 20 may be etched until the upper surface of the first mask 10 is exposed or to a position higher than the upper surface of the first mask 10 to form the third opening 80, and the first mask 10, the upper portion of the active pattern 105 and the portion of the first sacrificial layer 20 on the first mask 10 may be etched altogether using the etching gas having no or little etching selectivity therebetween to form the fourth opening 90. Thus, etching byproduct, which may be formed by an etching process for the first mask 10 and the active pattern 105 using an etching gas having an etching selectivity between the first sacrificial layer 20 and the first mask 10 and the active pattern 105, may not be formed. Accordingly, there is no need to remove the etching byproduct, and thus the etching process may not be performed for a long time. As a result, the width of the fourth opening 90 may not increase, and the process margin for the distance between the active patterns 105 may not be reduced.

In example embodiments, a trimming process in which each of the active patterns 105 extending in the third direction may be divided into a plurality of pieces spaced apart from each other in the third direction, may be performed with a larger process margin, less failure, and shorter time.

Up to now, the active patterns 105 are formed by forming the first mask 10 on the substrate 100 and etching an upper portion of the substrate 100 using the first mask 10 as an etching mask, however, the inventive concept may not be limited thereto. For example, the active patterns 105 may be formed by following processes.

Figure 12:
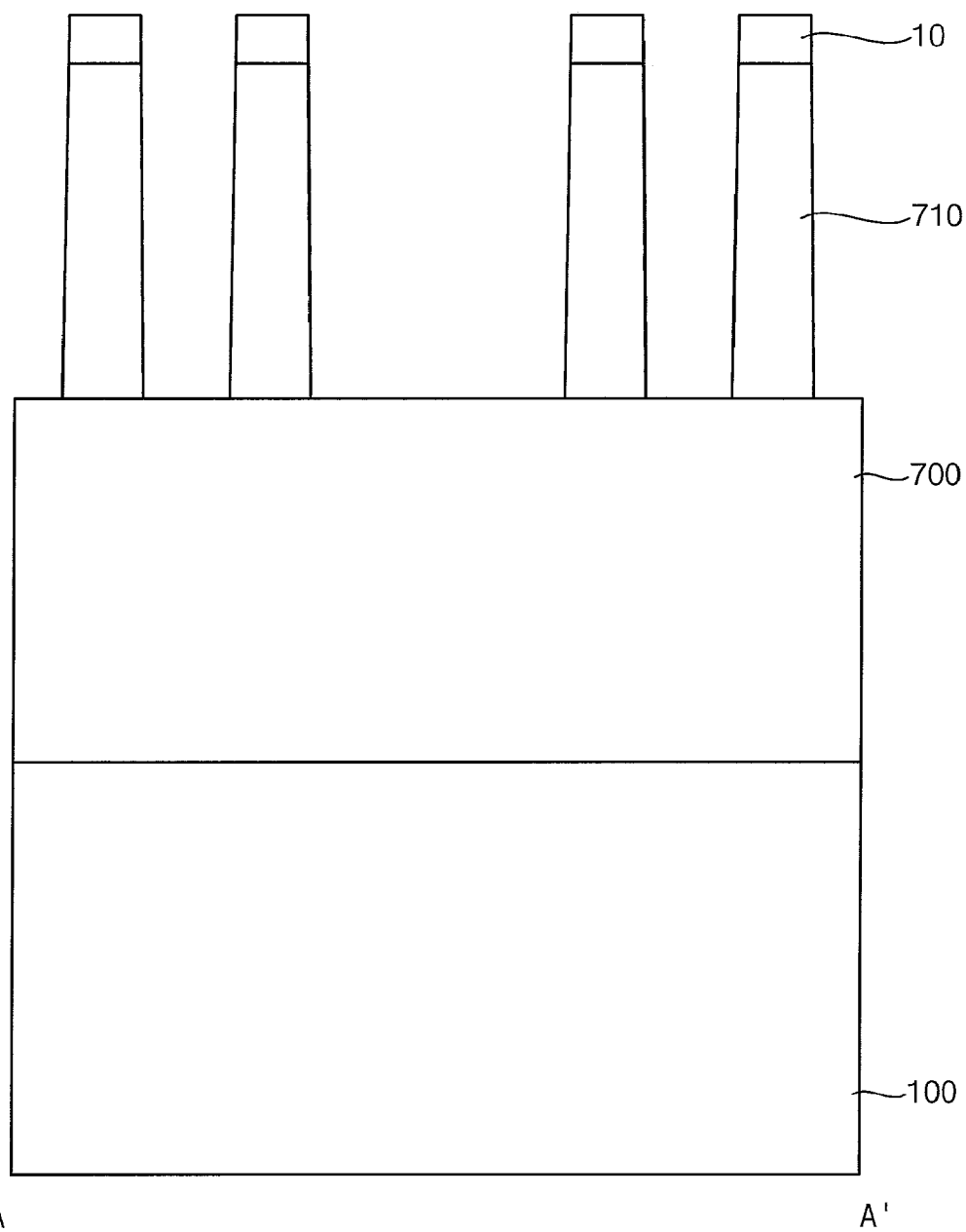

Referring to FIG. 12, a first layer 700 including, e.g., silicon oxide, and a second layer including, e.g., polysilicon may be sequentially stacked on the substrate 100, and the second layer may be etched using the first mask 10 as an etching mask to form second patterns 710 each extending in the third direction and being spaced apart from each other in the fourth direction.

Figure 13:
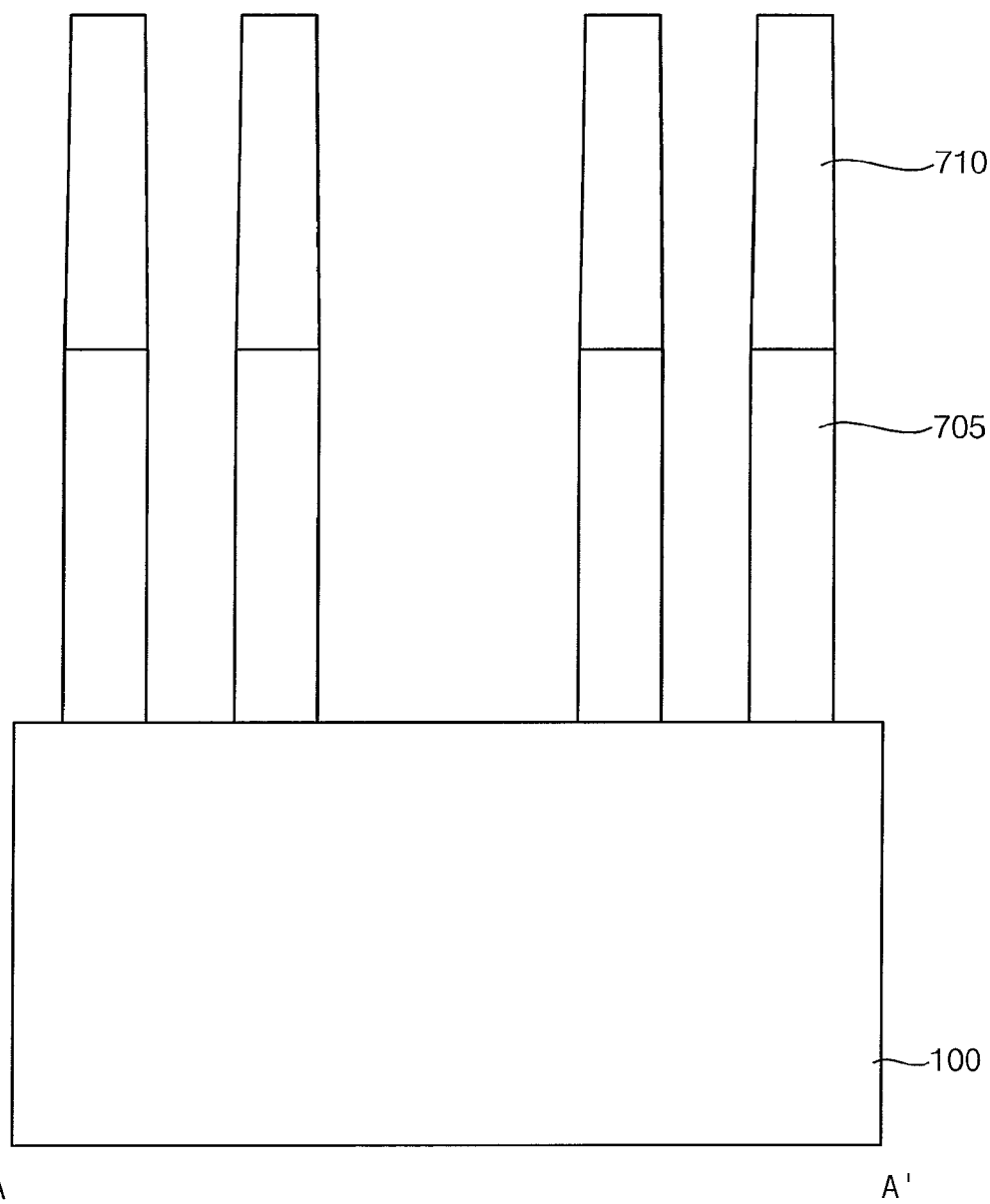

Referring to FIG. 13, processes substantially the same as or similar to those illustrated with reference to FIGS. 1 to 9 may be performed, so that a trimming process may be performed on the second patterns 710.

The first sacrificial layer 20 may be removed, and the first layer 700 may be etched using the first mask 10 and the second patterns 710 as an etching mask to form first patterns 705.

Figure 14:
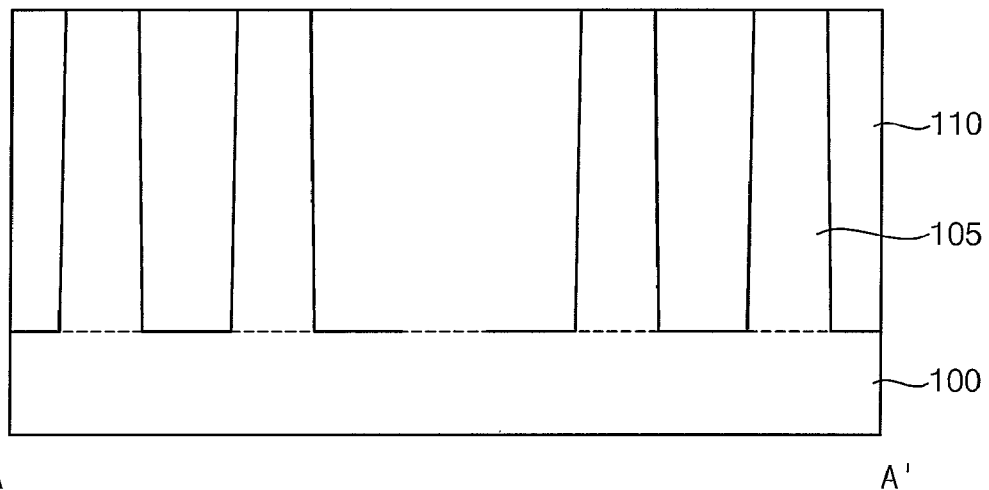

Referring to FIG. 14, an upper portion of the substrate 100 may be etched using the first and second patterns 705 and 710 as an etching mask to form the active patterns 105 on the substrate 100.

During the etching process, the second patterns 710 may be removed, and the remaining first patterns 705 may be further removed. The isolation pattern 110 may be formed to cover sidewalls of the active patterns 105.

Up to now, a method of dividing each of the active patterns 105 by a trimming process has been illustrated, however, the inventive concept may not be limited thereto. For example, the invention may be applied to any method of cutting a fine pattern into a plurality of pieces spaced apart from each other by a fine distance through a trimming process.

Figure 15:
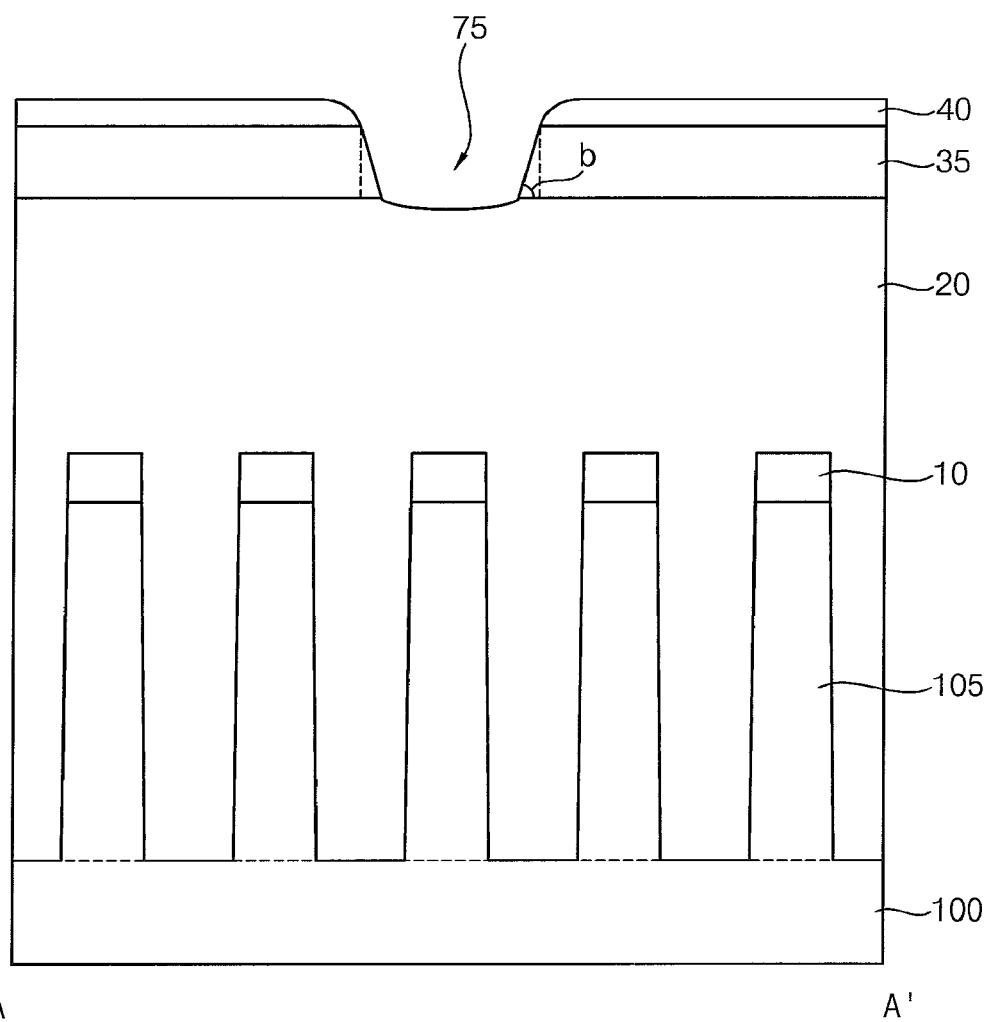
FIGS. 15, 16A-16B, and 17A-17B are cross-sectional views illustrating a method of forming active patterns, according to comparative embodiments.

FIGS. 15 to 17 are cross-sectional views illustrating a method of forming active patterns according to comparative embodiment. This method may include processes substantially the same as or similar to those illustrated with reference to FIGS. 1 to 11, and repeated descriptions thereof are omitted herein.

Referring to FIG. 15, processes substantially the same as or similar to those illustrated with reference to FIGS. 1 to 4 may be performed, and processes substantially the same as or similar to those illustrated with reference to FIG. 5 may be performed. Thus, a sixth opening 75 may be formed through the second mask layer 30 to expose an upper surface of the first sacrificial layer 20 by an etching process, and the second mask layer 30 may be transformed into the second mask 35.

However, when the etching process is performed using the photoresist pattern 40 and the first spacer 65 as an etching mask, an etching gas including $CF_4$ gas and $CHF_3$ gas may be used. The etching gas may not include sulfur, unlike the etching gas illustrated with reference to FIG. 5, and thus carbon-sulfur (C—S) bonds may not be formed so that the etching of the photoresist pattern 40 may not be restrained. Accordingly, most portion of the photoresist pattern 40 may be removed during the etching process, and particularly, a portion of the photoresist pattern 40 adjacent to the sixth opening 75 may be mainly removed so that the sixth opening 75 may have a sidewall having a low slope.

Additionally, the $CF_4$ gas included in the etching gas may include an amount of fluorine (F) less than that of $SF_6$ gas, and thus the second mask layer 30 including PE-SiON may be etched at a low rate. Accordingly, the etching process has to be performed for a long time in order to expose the upper surface of the first sacrificial layer 20 by the sixth opening 75, so that the sixth opening 75 may have a wide width.

As a result, an angle b of the sidewall of the sixth opening 75 with respect to the upper surface of the substrate 100 may be less than an angle a of the sidewall of the second opening 70 with respect to the upper surface of the substrate 100, which is shown in FIG. 5.

Figure 16A:
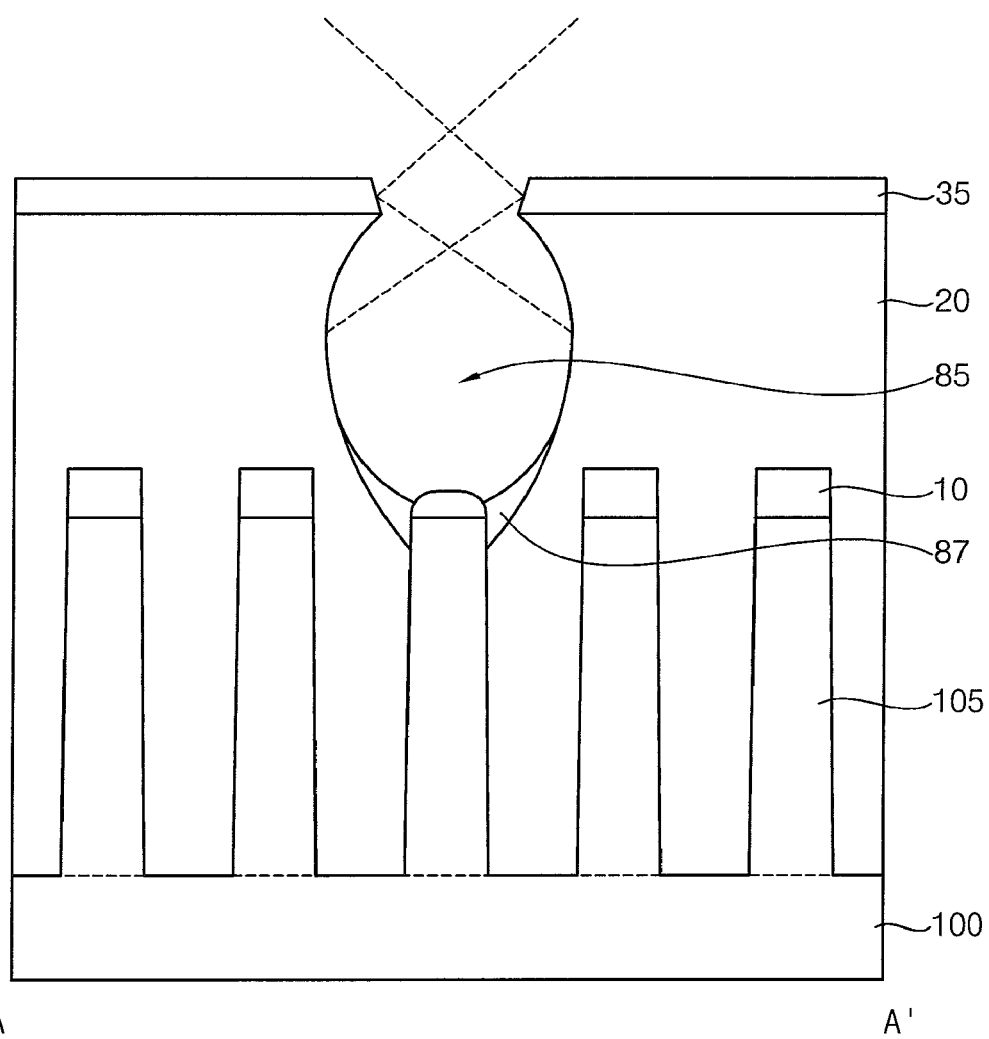
Figure 16B:
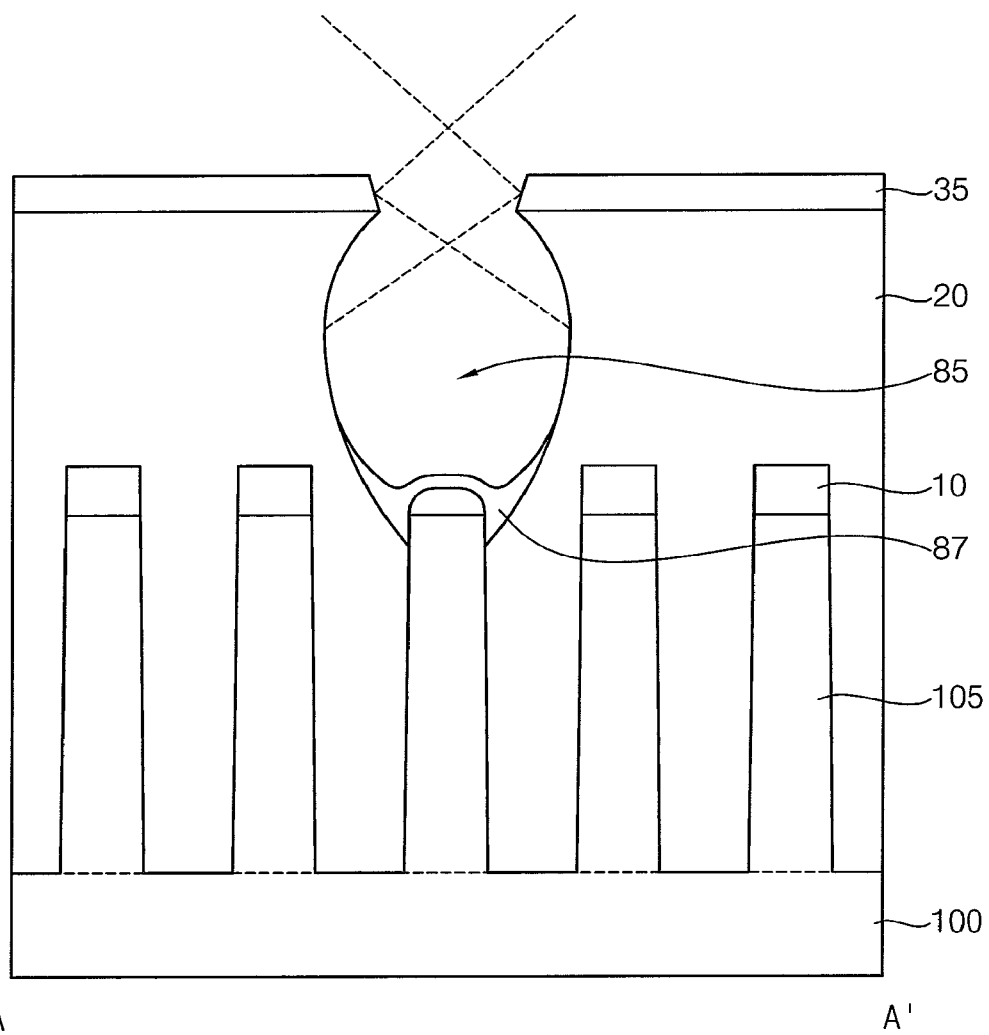

Referring to FIGS. 16A and 16B, processes substantially the same as or similar to those illustrated with reference to FIG. 6 may be performed, and thus the first sacrificial layer 20 exposed by the sixth opening 75 may be etched to form a seventh opening 85.

However, the sidewall of the sixth opening 75, that is, the sidewall of the second mask 35 exposed by the sixth opening 75, may have a low slope, and thus the etching gas may be obliquely reflected on the sidewall of the second mask 35 to etch the first sacrificial layer 20, which may cause the bowing phenomenon. Accordingly, the first sacrificial layer 20 has to have a relatively large thickness in the vertical direction in order that a width of the seventh opening 85 may correspond to only one of the active patterns 105, and thus the second mask layer 30 serving as an etching mask for the first sacrificial layer 20 has to have a relatively large thickness in the vertical direction. As a result, the etching process for the second mask layer 30 may be performed for a longer time, and the sixth opening 75 may have a relatively larger width.

The etching process for the first sacrificial layer 20 may be performed for a given time even after the upper surface of the first mask 10 and a portion of the active pattern 105 thereunder are exposed. Thus, the first mask 10 and the portion of the active pattern 105 may be sputtered by the etching gas for the first sacrificial layer 20 including SOH, which may include oxygen gas and argon gas, and thus an etching byproduct 87 including silicon oxycarbide (SiOC) may be deposited on a bottom and a sidewall of the seventh opening 85.

The etching byproduct 87 may not be easily removed, and the seventh opening 85 may not keep its shape on the active pattern 105. FIG. 16A shows the etching byproduct 87 is formed on sidewalls of the first mask 10 and the upper portion of the active pattern 105, and FIG. 16B shows the etching byproduct 87 is formed on sidewalls of the first mask 10 and the upper portion of the active pattern 105 and also on an upper surface of the first mask 10 so that the first mask 10 may not be exposed by the seventh opening 85.

Figure 17A:
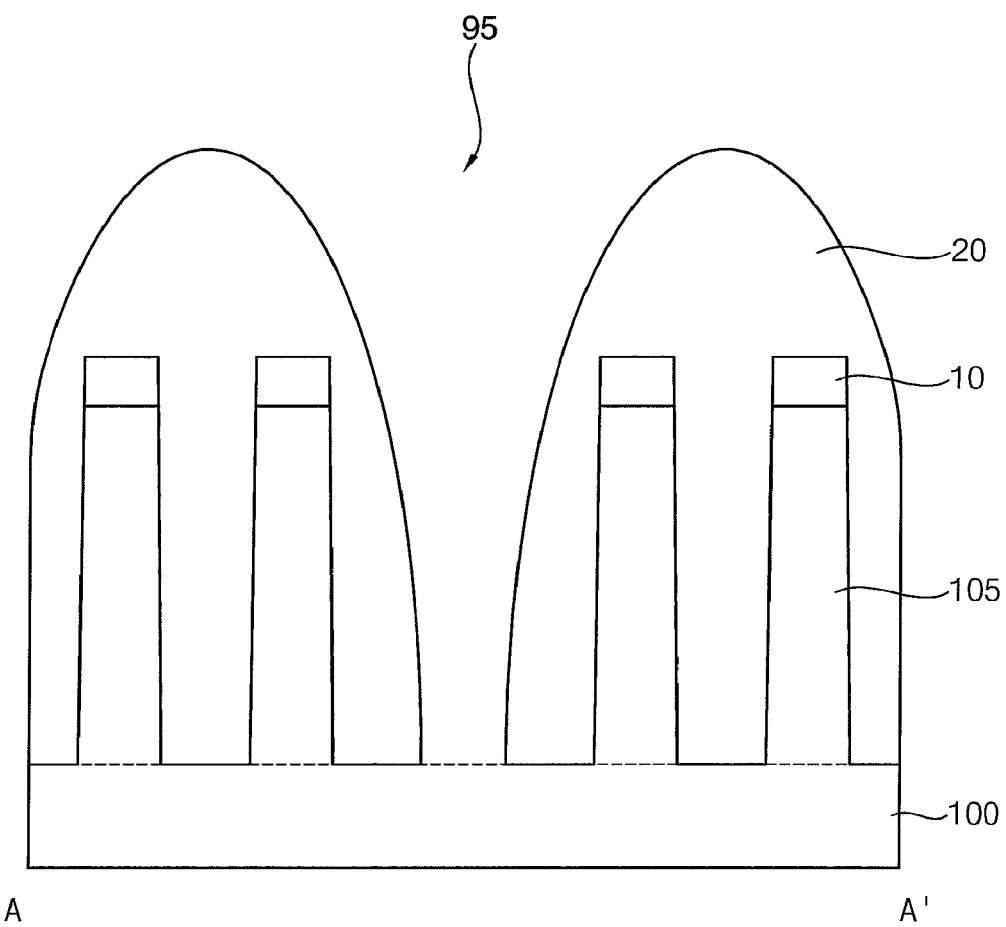
Figure 17B:
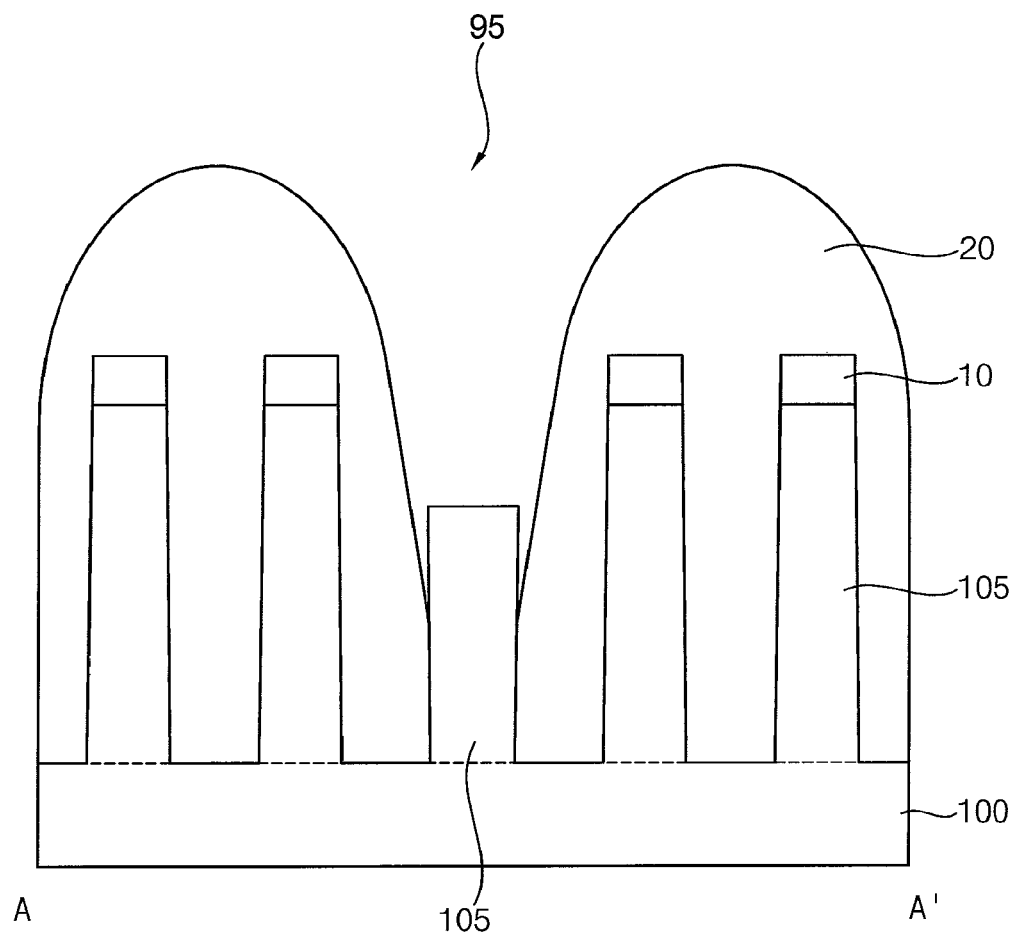

Referring to FIGS. 17A and 17B, processes substantially the same as or similar to those illustrated with reference to FIG. 9 may be performed so that a fifth opening 95 exposing an upper surface of the substrate 100 may be formed. FIG. 17A shows the fifth opening 95 is formed through the first sacrificial layer 20 of FIG. 16A, removing the first mask 10 and the active pattern 105 and exposing an upper surface of the substrate 100, and FIG. 17B shows the fifth opening 95 is formed in the first sacrificial layer 20 of FIG. 16B, removing the first mask 10 and the upper portion of the active pattern 105.

Processes substantially the same as or similar to those illustrated with reference to FIGS. 10 and 11 may be performed to complete the formation of the active patterns.

As illustrated above, in the method of forming the active patterns in accordance with comparative embodiment, during the etching process for etching the second mask layer 30 to form the second mask 35, CF$_4$ gas and CHF$_3$ gas may be used, and thus the etching selectivity between the photoresist pattern 40 and the second mask layer 30 may be low, and the sidewall of the sixth opening 75 extending through the second mask layer 30 may have a lower slope and a wider width.

Additionally, due to the lower slope of the second mask 35, a bowing phenomenon may be generated on the seventh opening 85 when the first sacrificial layer 20 is etched, and thus thicknesses of the first sacrificial layer 20 and the second mask layer 30 may increase. Accordingly, the width of the sixth opening 75 extending through the second mask layer 30 may increase.

Furthermore, when the first sacrificial layer 20 is etched, the first mask 10 and the portion of the active pattern 105 may be also removed to form the etching byproduct 87, and thus the active pattern 105 may not be removed even though the sixth and seventh openings 75 and 85 have larger sizes.

As a result, in the method of forming the active patterns in accordance with comparative embodiment, the trimming process in which each of the active patterns 105 extending in the third direction is partially removed has to be performed for a longer time, and the active pattern 105 may not be sufficiently removed. As the fifth opening 95 for dividing the active patterns 105 has the larger size, process margin for the distance with other structures may decrease.

FIGS. 18 to 33 are plan views and cross-sectional views illustrating a method of manufacturing a semiconductor device according to example embodiments. Specifically, FIGS. 18, 20, 23, 27 and 32 are the plan views, and each of FIGS. 19, 21-22, 24-26, 28-31 and 33 includes cross-sections taken along lines B-B' and C-C' of a corresponding plan view.

This method is application of the method of forming the active patterns illustrated with reference to FIGS. 1 to 11 to a method of manufacturing a dynamic random access memory (DRAM) device, and repeated descriptions on the method of forming the active patterns are omitted herein.

Figure 18:
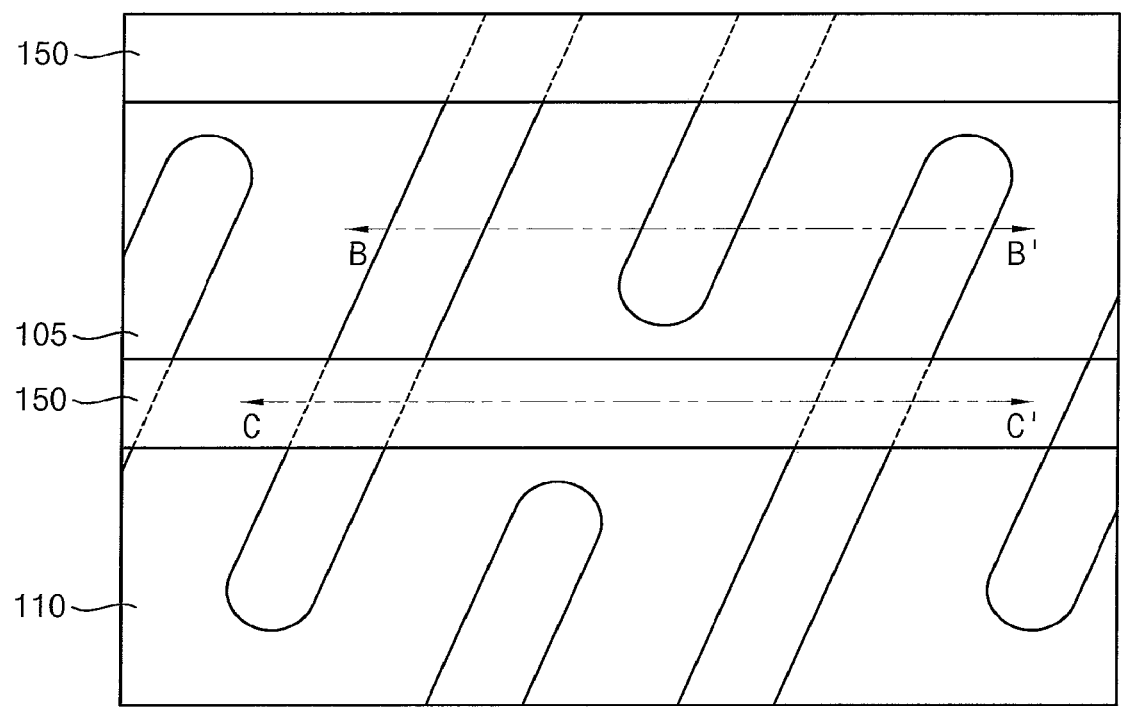
FIGS. 18 to 33 are plan views and cross-sectional views illustrating a method of manufacturing a semiconductor device, according to example embodiments.
Figure 18:
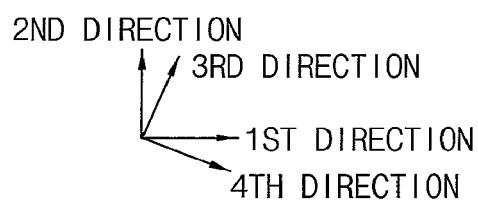
Figure 19:
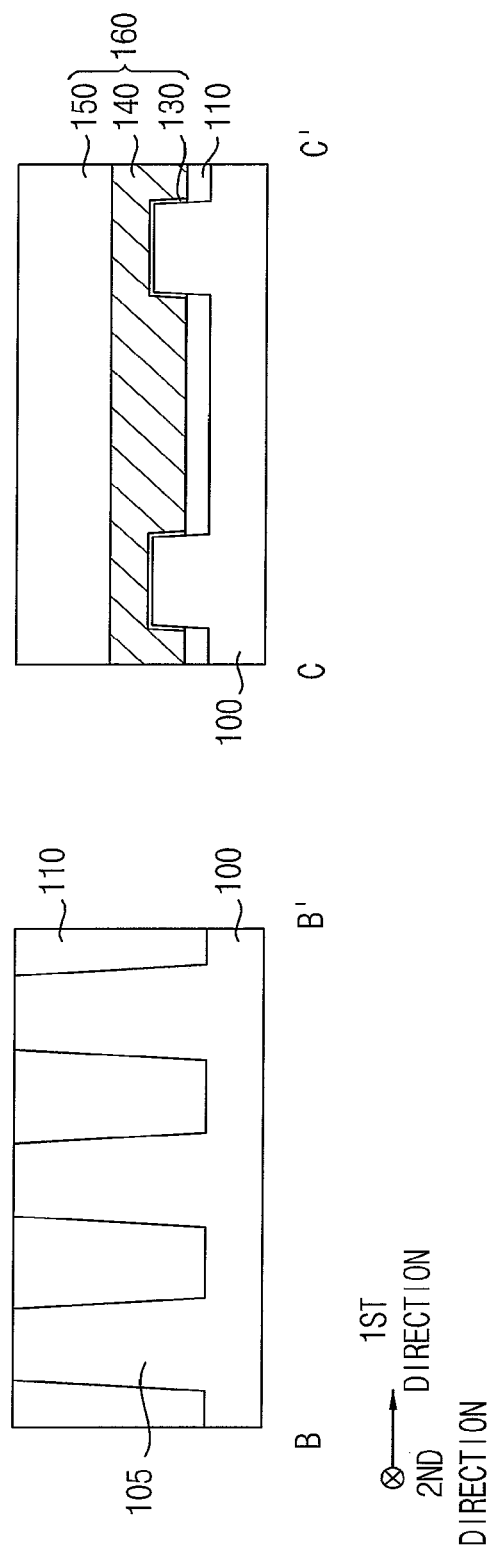

Referring to FIGS. 18 and 19, processes substantially the same as or similar to those illustrated with reference to FIGS. 1 to 11 may be performed to form the active patterns 105 on the substrate 100, and the isolation pattern 110 may be formed on the substrate 100 to cover sidewalls of the active patterns 105.

An impurity region may be formed in the substrate 100 by performing, e.g., an ion implantation process, and the active pattern 105 and the isolation pattern 110 may be partially etched to form a first recess extending lengthwise in the first direction.

A gate structure 160 may be formed in the first recess. The gate structure 160 may include a gate insulation layer 130 on a surface of the active pattern 105 exposed by the first recess, a gate electrode 140 on the gate insulation layer 130 to fill a lower portion of the first recess, and a gate mask 150 on the gate electrode 140 to fill an upper portion of the first recess. The gate structure 160 may extend in the first direction, and a plurality of gate structures 160 may be spaced apart from each other in the second direction. The gate structure 160 may be buried at upper portions of the active pattern 105. For example, at least part of the gate structure 160 may be formed at a level lower than a top surface of the upper portion of the active pattern 105, and the gate structure 160 may be at least partially surrounded by the upper portion of the active pattern 105.

The gate insulation layer 130 may be formed by performing a thermal oxidation process on the surface of the active pattern 105 exposed by the first recess, and thus may include, for example, silicon oxide. The gate insulation layer 130 may be formed on the top surface and upper side surfaces of the active pattern 105.

Figure 20:
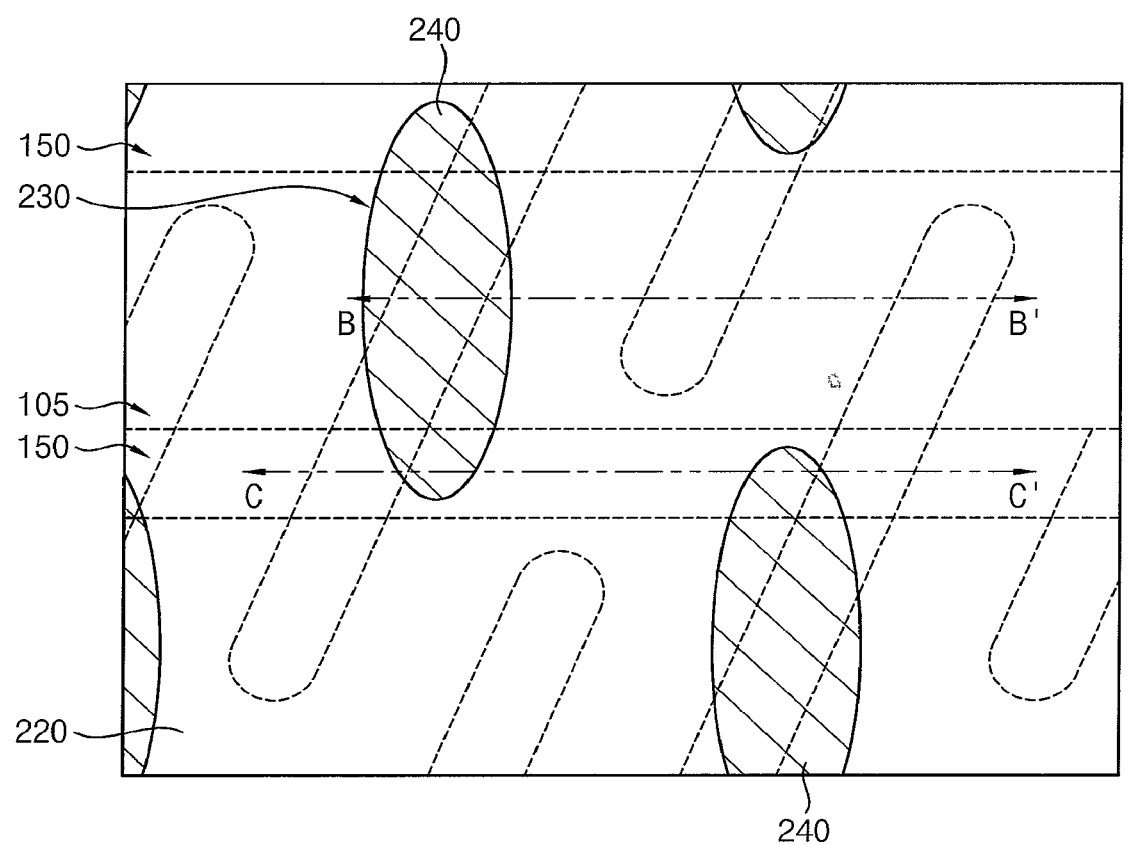
Figure 20:
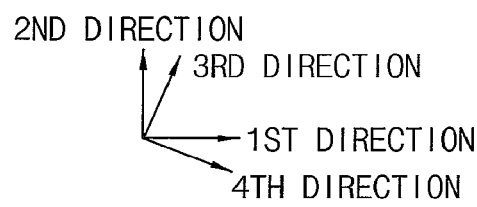
Figure 21:
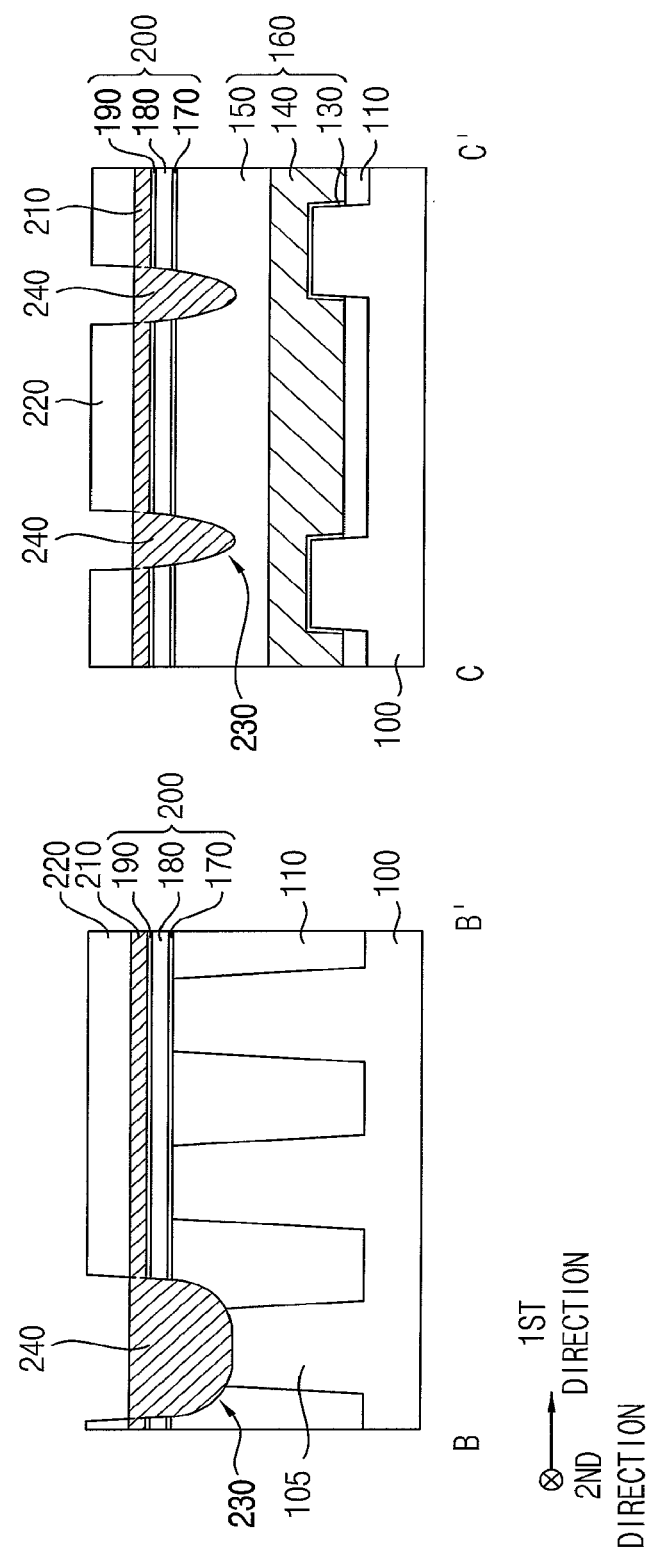

Referring to FIGS. 20 and 21, an insulation layer structure 200, a first conductive layer 210 and a third mask 220 may be sequentially formed on the substrate 100, and the first conductive layer 210 and the insulation layer structure 200 may be etched using the third mask 220 as an etching mask to form a first hole 230 exposing the active pattern 105.

In example embodiments, the insulation layer structure 200 may include first, second, and third insulation layers 170, 180, and 190 sequentially stacked. The first and third insulation layers 170 and 190 may include an oxide, e.g., silicon oxide, and the second insulation layer 180 may include a nitride, e.g., silicon nitride.

The first conductive layer 210 may include, for example, polysilicon doped with impurities, and the third mask 220 may include a nitride, e.g., silicon nitride.

During the etching process, upper portions of the active pattern 105, the isolation pattern 110 and the gate mask 150 exposed by the first hole 230 may be also etched to form a second recess. For example, a bottom of the first hole 230 may be referred to as the second recess.

In example embodiments, the first hole 230 may expose an upper surface of a central portion of each of the active patterns 105 extending in the third direction, and thus a plurality of first holes 230 may be formed in each of the first and second directions. Each of the first holes 230 may have an elliptical shape having a long axis and a short axis in a plan view. In some embodiments, a long axis of each first hole 230 may be parallel to the second direction.

A second conductive layer 240 may be formed to fill the first hole 230.

In example embodiments, the second conductive layer 240 may be formed by forming a preliminary second conductive layer on the active pattern 105, the isolation pattern 110, the gate mask 150, and the third mask 220 to fill the first hole 230, and removing an upper portion of the preliminary second conductive layer through a CMP process and/or an etch back process. The second conductive layer 240 may have an upper surface substantially coplanar with an upper surface of the first conductive layer 210.

In example embodiments, a plurality of second conductive layers 240 may be spaced apart from each other in each of the first and second directions. The second conductive layer 240 may include, for example, doped polysilicon, and may be merged to the first conductive layer 210.

Figure 22:
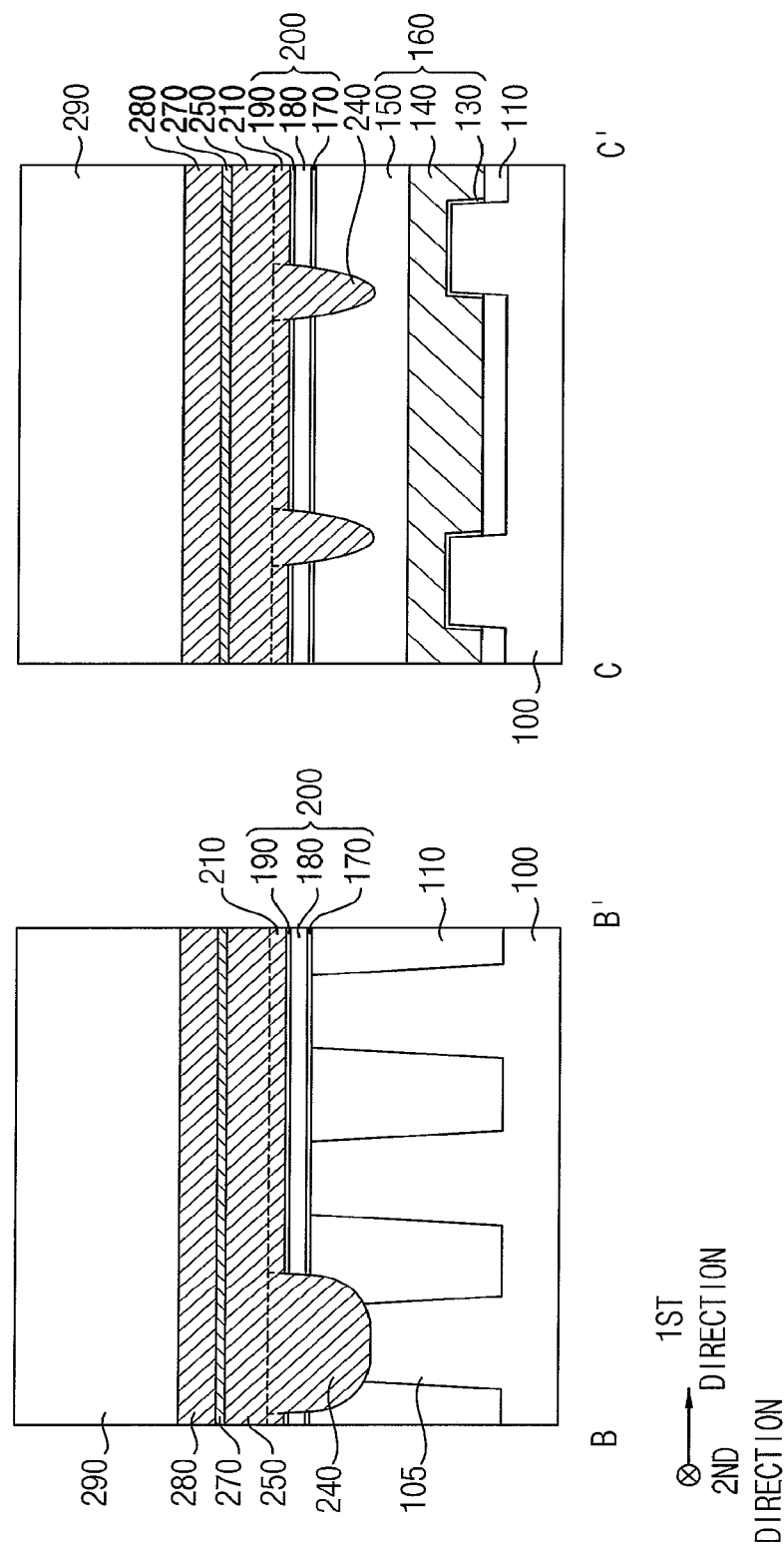

Referring to FIG. 22, after removing the third mask 220, a third conductive layer 250, a barrier layer 270, a first metal layer 280, and a first capping layer 290 may be sequentially formed on the first and second conductive layers 210 and 240.

In example embodiments, the third conductive layer 250 may include a material substantially the same as that of the first and second conductive layers 210 and 240. For example, the third conductive layer 250 may include doped polysilicon, and thus, in some embodiments, may be merged with the first and second conductive layers 210 and 240. The barrier layer 270 may include a metal nitride, e.g., titanium nitride, tantalum nitride, tungsten nitride, etc., the first metal layer 280 may include a metal, e.g., tungsten, titanium, tantalum, etc., and the first capping layer 290 may include a nitride, e.g., silicon nitride.

Figure 23:
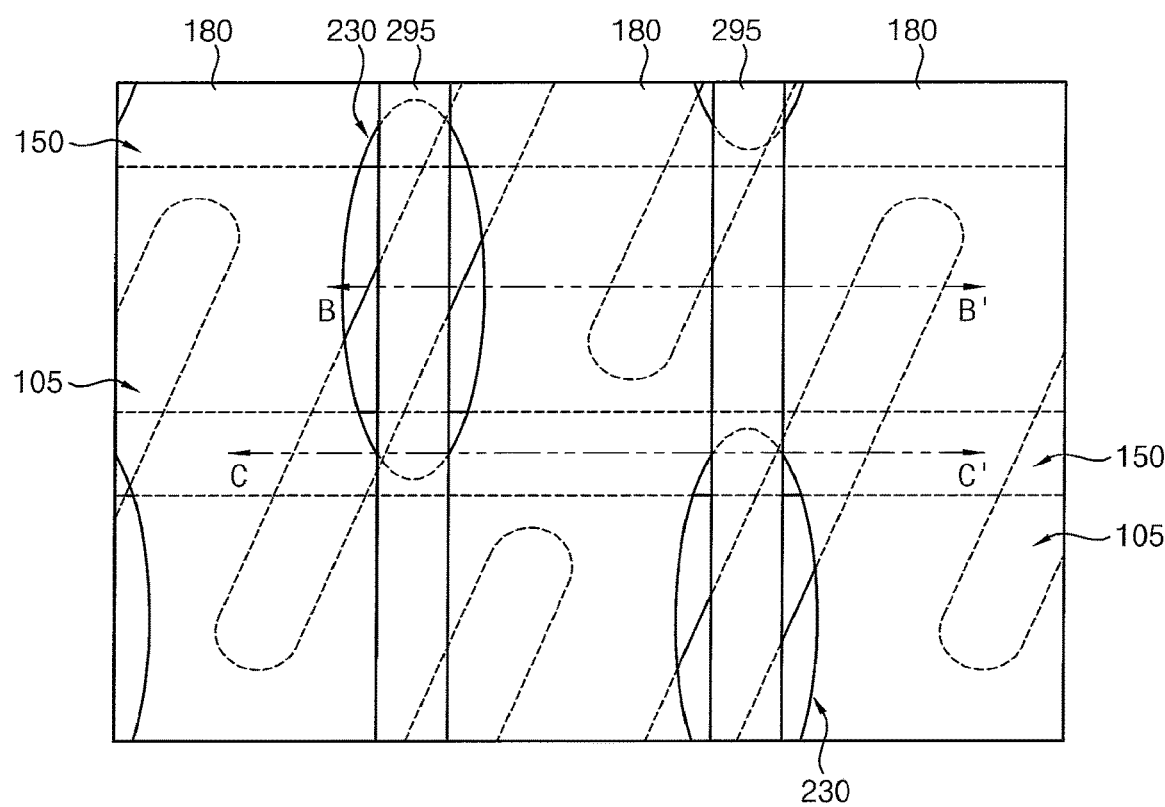
Figure 23:
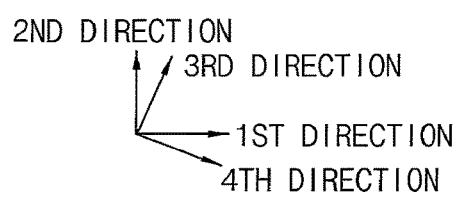
Figure 24:
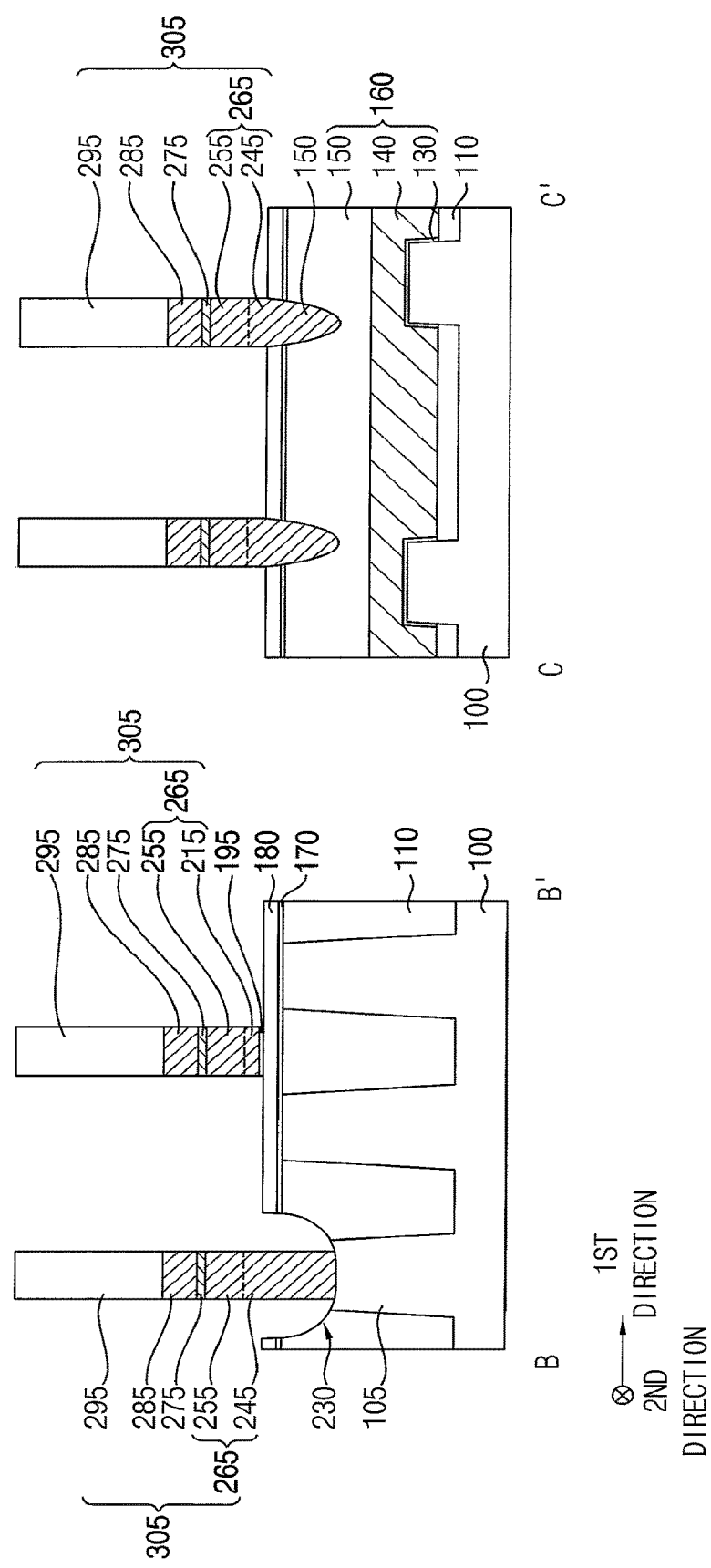

Referring to FIGS. 23 and 24, the first capping layer 290 may be patterned to form a first capping pattern 295, and the first metal layer 280, the barrier layer 270, the third conductive layer 250, the first and second conductive layers 210 and 240, and the third insulation layer 190 may be sequentially etched using the first capping pattern 295 as an etching mask.

In example embodiments, the first capping pattern 295 may extend lengthwise in the second direction on the substrate 100, and a plurality of first capping patterns 295 may be formed to be spaced apart from each other in the first direction.

By the etching process, a second conductive pattern 245, a third conductive pattern 255, a barrier pattern 275, a first metal pattern 285, and the first capping pattern 295 may be sequentially stacked on the active pattern 105, the isolation pattern 110 and the gate mask 150 in the first hole 230, and a third insulation pattern 195, a first conductive pattern 215, the third conductive pattern 255, the barrier pattern 275, the first metal pattern 285, and the first capping pattern 295 may be sequentially stacked on the second insulation layer 180 of the insulation layer structure 200 at an area outside of the first hole 230.

As illustrated above, the first to third conductive layers 210, 240, and 250 may be merged with each other, and thus the second and third conductive patterns 245 and 255 sequentially stacked and the first and third conductive patterns 215 and 255 sequentially stacked may each form one first conductive structure 265. Hereinafter, the first conductive structure 265, the barrier pattern 275, the first metal pattern 285, and the first capping pattern 295 sequentially stacked may be referred to as a bit line structure 305.

In example embodiments, the bit line structure 305 may extend lengthwise in the second direction on the substrate 100, and a plurality of bit line structures 305 may be spaced apart from each other in the first direction. Each of the bit line structures 305 may contact a central portion in the third direction of a corresponding one of the active patterns 105 through the first hole 230 to be electrically connected thereto.

Figure 25:
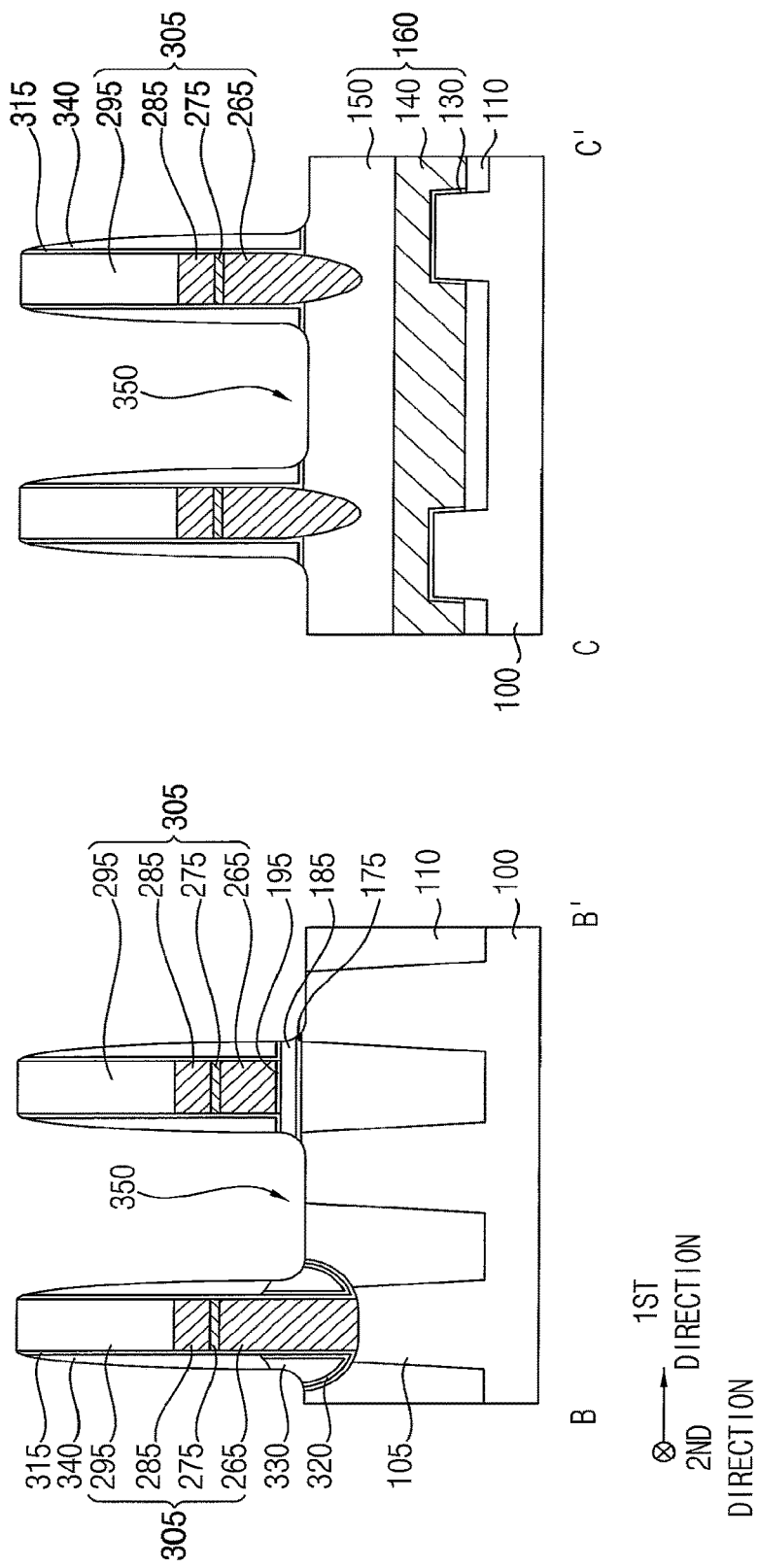

Referring to FIG. 25, a second spacer layer may be formed on upper surfaces of the active pattern 105, the isolation pattern 110 and the gate mask 150 exposed by the first hole 230, a sidewall of the first hole 230, and the second insulation layer 180 to cover the bit line structure 305, and fourth and fifth insulation layers may be sequentially formed on the second spacer layer.

The second spacer layer may also cover a sidewall of the third insulation pattern 195 between the second insulation layer 180 and the bit line structure 305, and the fifth insulation layer may fill the first hole 230.

The fourth and fifth insulation layers may be etched by an etching process. In example embodiments, the etching process may be performed by a wet etch process, and other portions of the fourth and fifth insulation layers except for a portion in the first hole 230 may be removed. Thus, most of an entire surface of the second spacer layer, that is, an entire surface except for a portion thereof in the first hole 230, may be exposed, and portions of the fourth and fifth insulation layers remaining in the first hole 230 may form fourth and fifth insulation patterns 320 and 330, respectively.

A third spacer layer may be formed on the exposed surface of the second spacer layer and the fourth and fifth insulation patterns 320 and 330 in the first hole 230, and may be anisotropically etched to form a third spacer 340 on the surface of the second spacer layer and the fourth and fifth insulation patterns 320 and 330 to cover a sidewall of the bit line structure 305.

A dry etching process may be performed using the first capping pattern 295 and the third spacer 340 as an etching mask to form a tenth opening 350 exposing the upper surface of the active pattern 105. The upper surface of the isolation pattern 110 and the upper surface of the gate mask 150 may be also exposed by the tenth opening 350.

By the dry etching process, portions of the second spacer layer on an upper surface of the first capping pattern 295 and an upper surface of the second insulation layer 180 may be removed, and thus a second spacer 315 covering the sidewall of the bit line structure 305 may be formed. Additionally, during the dry etching process, the first and second insulation layers 170 and 180 may be partially removed, such that first and second insulation patterns 175 and 185 may remain under the bit line structure 305. The first to third insulation patterns 175, 185, and 195 that are sequentially stacked under the bit line structure 305 may form an insulation pattern structure.

Figure 26:
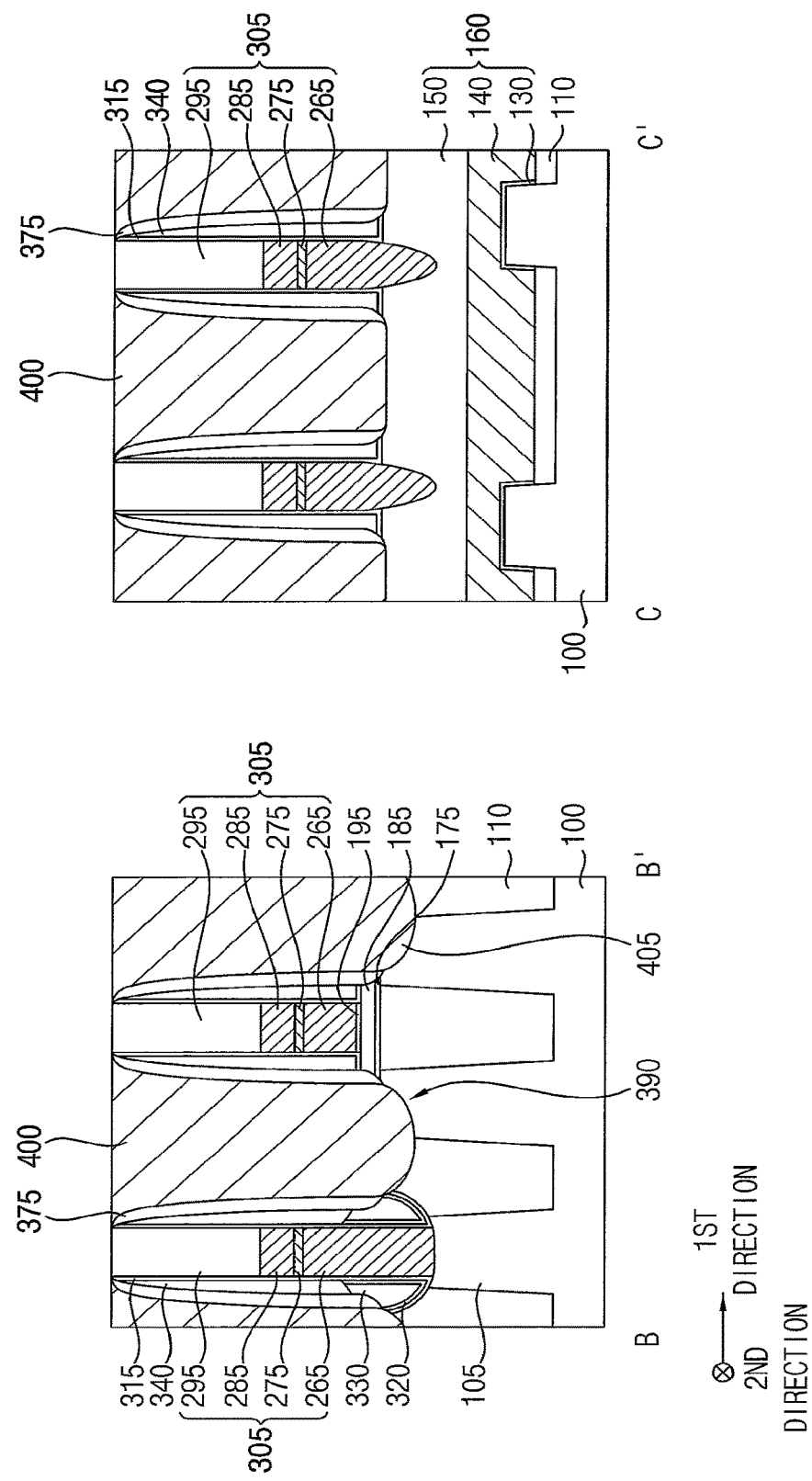

Referring to FIG. 26, a fourth spacer layer may be formed on the upper surface of the first capping pattern 295, and an outer sidewall of the third spacer 340, portions of upper surfaces of the fourth and fifth insulation patterns 320 and 330, and the upper surfaces of the active pattern 105, the isolation pattern 110, and the gate mask 150 exposed by the tenth opening 350, and may be anisotropically etched to form a fourth spacer 375 covering the sidewall of the bit line structure 305.

The fourth spacer layer may include a nitride, e.g., silicon nitride.

The second to fourth spacers 315, 340, and 375 sequentially stacked in a horizontal direction substantially parallel to the upper surface of the substrate 100 from the sidewall of the bit line structure 305 may be referred to as a first preliminary spacer structure.

An upper portion of the active pattern 105 may be removed by an etching process to form a third recess 390 connected to the tenth opening 350.

A lower contact plug layer 400 may be formed to fill the tenth opening 350 and the third recess 390 on the substrate 100, and an upper portion of the lower contact plug layer 400 may be planarized until the upper surface of the first capping pattern 295 is exposed. As a result of the planarization, upper surfaces of the lower contact plug layer 400 and the first capping pattern 295 may be coplanar with one another.

In example embodiments, the lower contact plug layer 400 may extend in the second direction, and a plurality of lower contact plug layers 400 may be formed to be spaced apart from each other in the first direction by the bit line structures 305.

Figure 27:
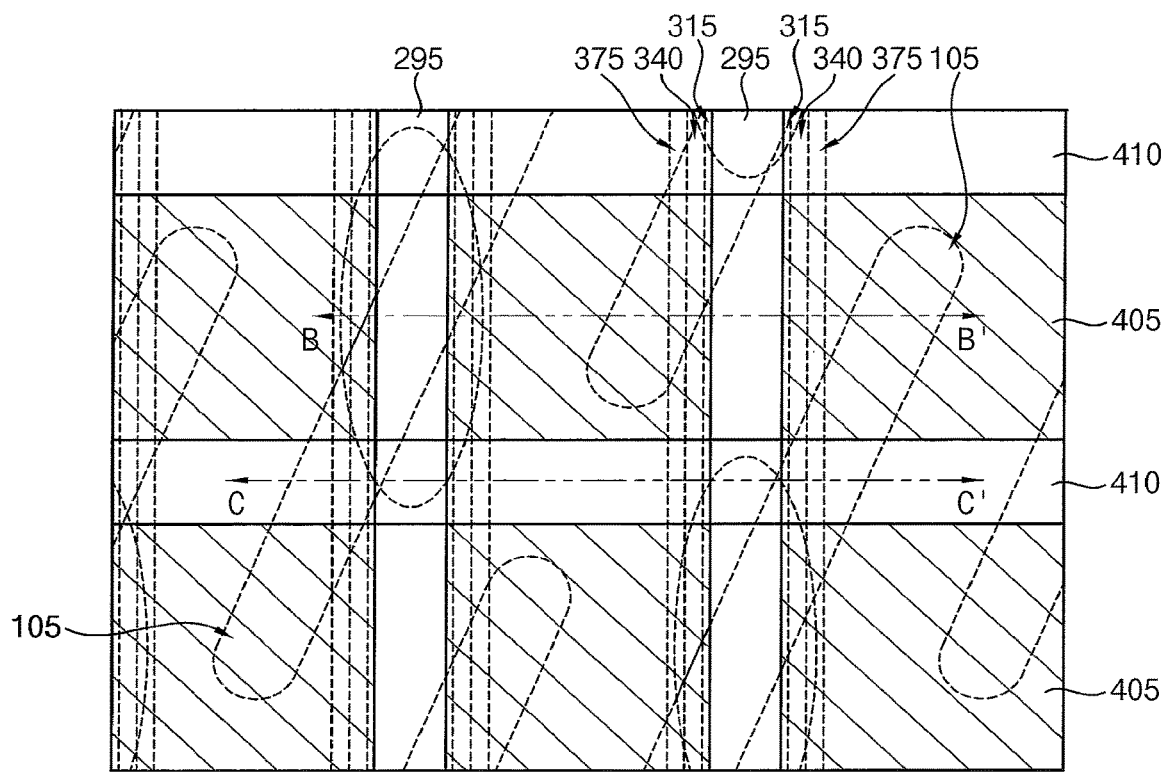
Figure 27:
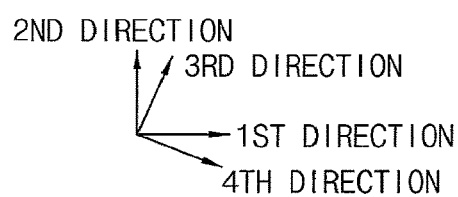
Figure 28:
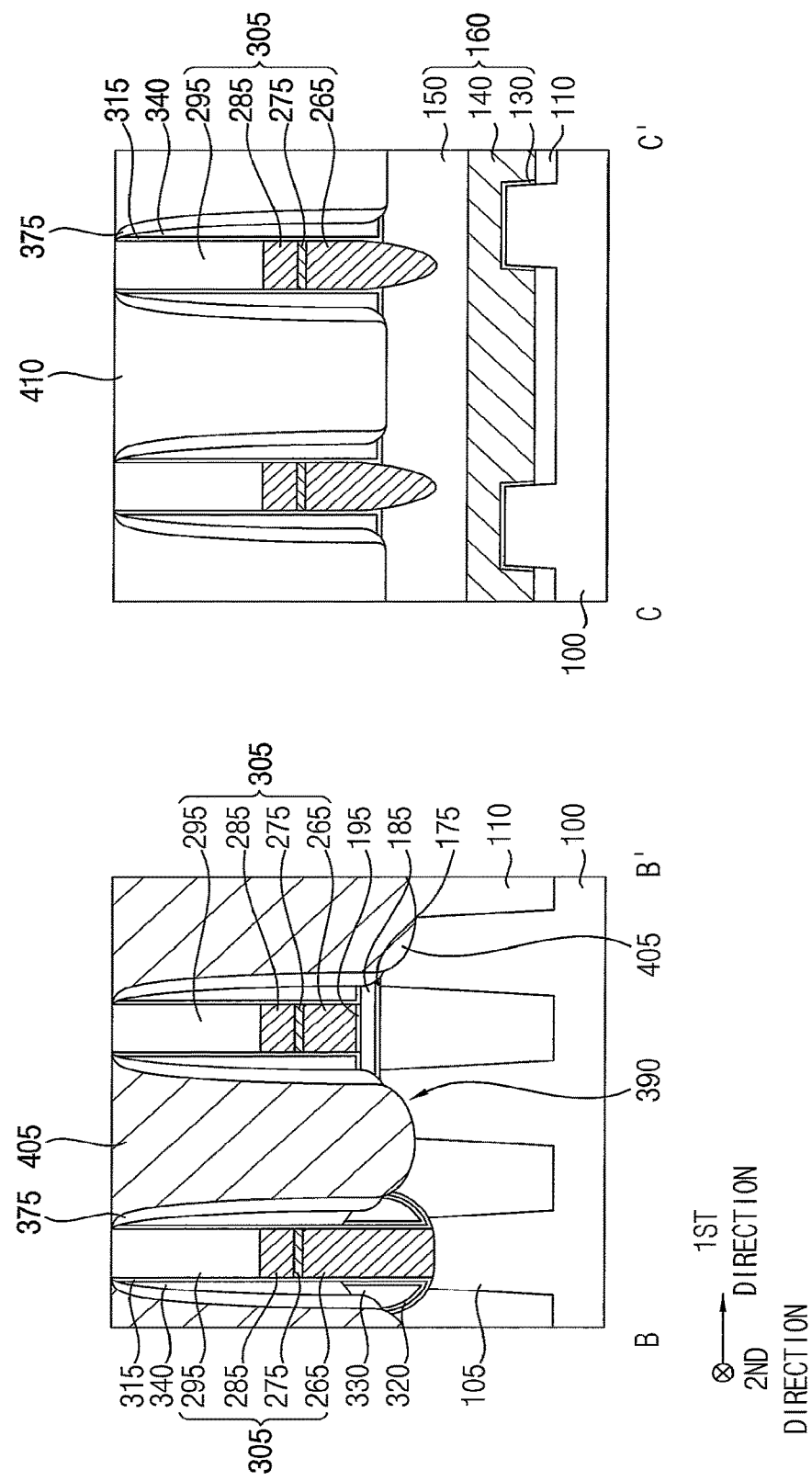

Referring to FIGS. 27 and 28, a fourth mask (not shown) including eleventh openings, each of which may extend in the first direction, spaced apart from each other in the second direction may be formed on the first capping pattern 295 and the lower contact plug layer 400, and the lower contact plug layer 400 may be etched using the fourth mask as an etching mask.

In example embodiments, each of the eleventh openings may overlap the gate structure 160 in a vertical direction substantially perpendicular to the upper surface of the substrate 100. By the etching process, a twelfth opening may be formed to expose the upper surface of the gate mask 150 of the gate structure 160 between the bit line structures 305 on the substrate 100.

After removing the fourth mask, a second capping pattern 410 may be formed on the substrate 100 to fill the twelfth opening. The second capping pattern 410 may include a nitride, e.g., silicon nitride. In example embodiments, the second capping pattern 410 may extend in the first direction between the bit line structures 305, and a plurality of second capping patterns 410 may be formed in the second direction.

Thus, the lower contact plug layer 400 extending in the second direction between the bit line structures 305 may be divided into a plurality of lower contact plugs 405 spaced apart from each other in the second direction by the second capping patterns 410. Each of the lower contact plugs 405 may contact one of opposite ends in the third direction of a corresponding one of the active patterns 105 to be electrically thereto.

Figure 29:
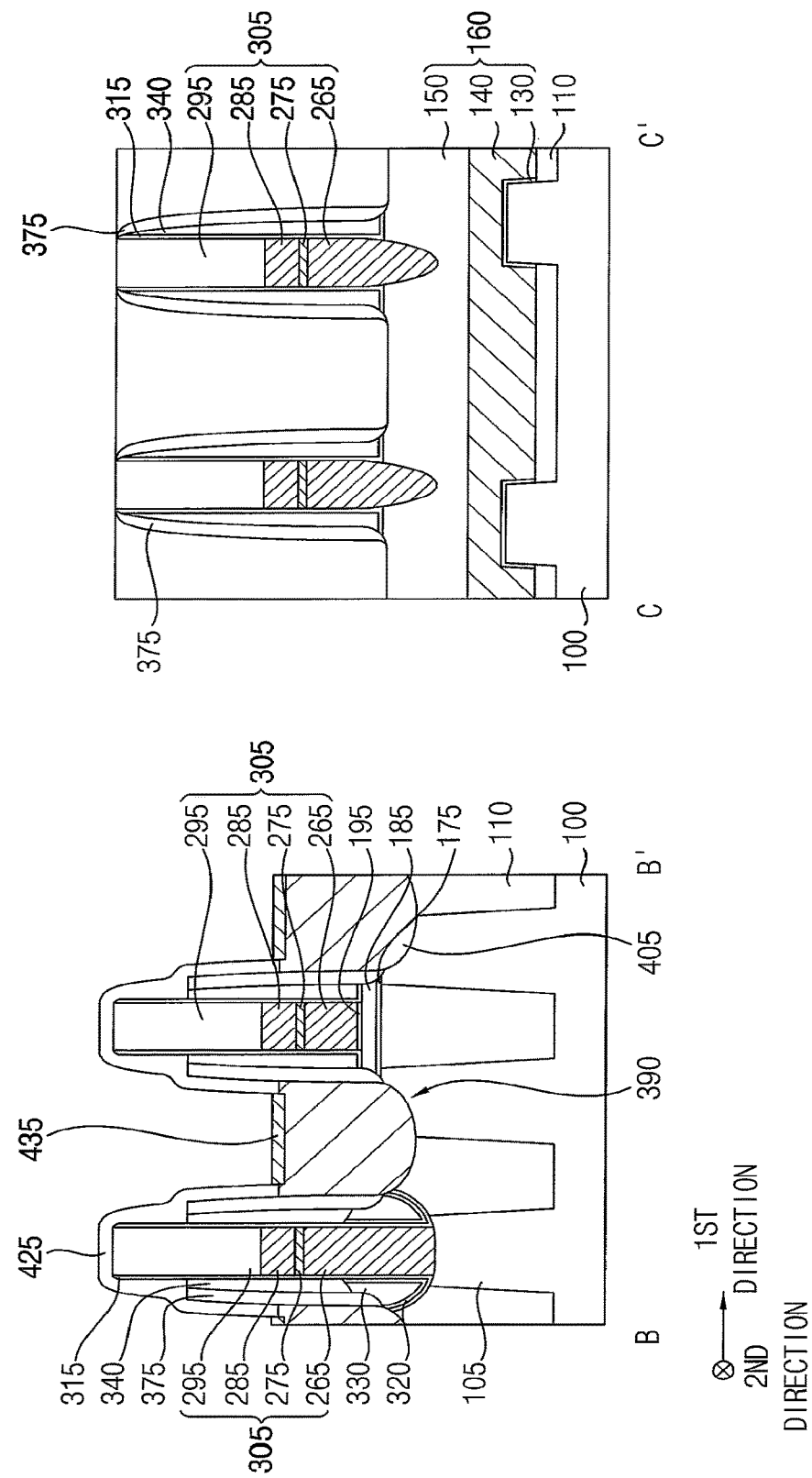

Referring to FIG. 29, an upper portion of the lower contact plug 405 may be removed to expose an upper portion of the preliminary spacer structure on the sidewall of the bit line structure 305, and upper portions of the third and fourth spacers 340 and 375 of the exposed preliminary spacer structure may be removed.

An etch back process may be further performed to remove an upper portion of the lower contact plug 405. Thus, the upper surface of the lower contact plug 405 may be lower than uppermost surfaces of the third and fifth spacers 340 and 375. In some embodiments, the upper surface of the lower contact plug 405 may be lower than an upper surface of the first metal pattern 285 and higher than a lower surface of the first metal pattern 285.

A fifth spacer layer may be formed on the bit line structure 305, the preliminary spacer structure, the second capping pattern 410, and the lower contact plug 405, and may be anisotropically etched so that a fifth spacer 425 may be formed to cover the second to fourth spacers 315, 340, and 375 on each of opposite sidewalls of the bit line structure 305 in the first direction, and an upper surface of the lower contact plug 405 may not be covered by the fifth spacer 425 but may be exposed.

A metal silicide pattern 435 may be formed on the exposed upper surface of the lower contact plug 405. In example embodiments, the metal silicide pattern 435 may be formed by forming a second metal layer on the first and second capping patterns 295 and 410, the fifth spacer 425, and the lower contact plug 405, thermally treating the second metal layer, and removing an unreacted portion of the second metal layer. The metal silicide pattern 435 may include, e.g., cobalt silicide, nickel silicide, titanium silicide, etc.

Figure 30:
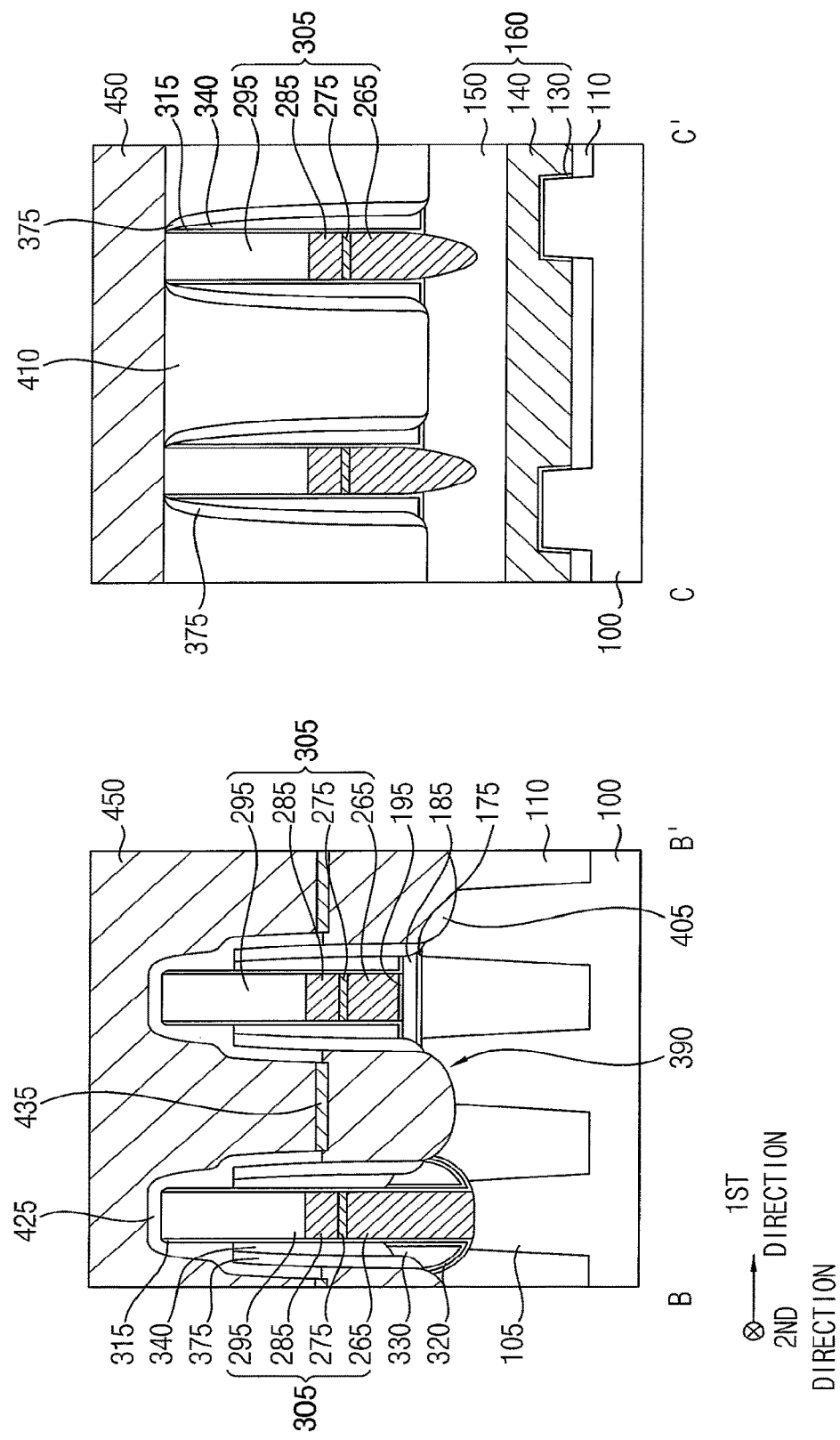

Referring to FIG. 30, an upper contact plug layer 450 may be formed on the first and second capping patterns 295 and 410, the second to fifth spacers 315, 340, 375, and 425, the metal silicide pattern 435, and the lower contact plug 405, and an upper portion of the upper contact plug layer 450 may be planarized.

In example embodiments, an upper surface of the upper contact plug layer 450 may be higher than those of the first and second capping patterns 295 and 410.

Figure 31:
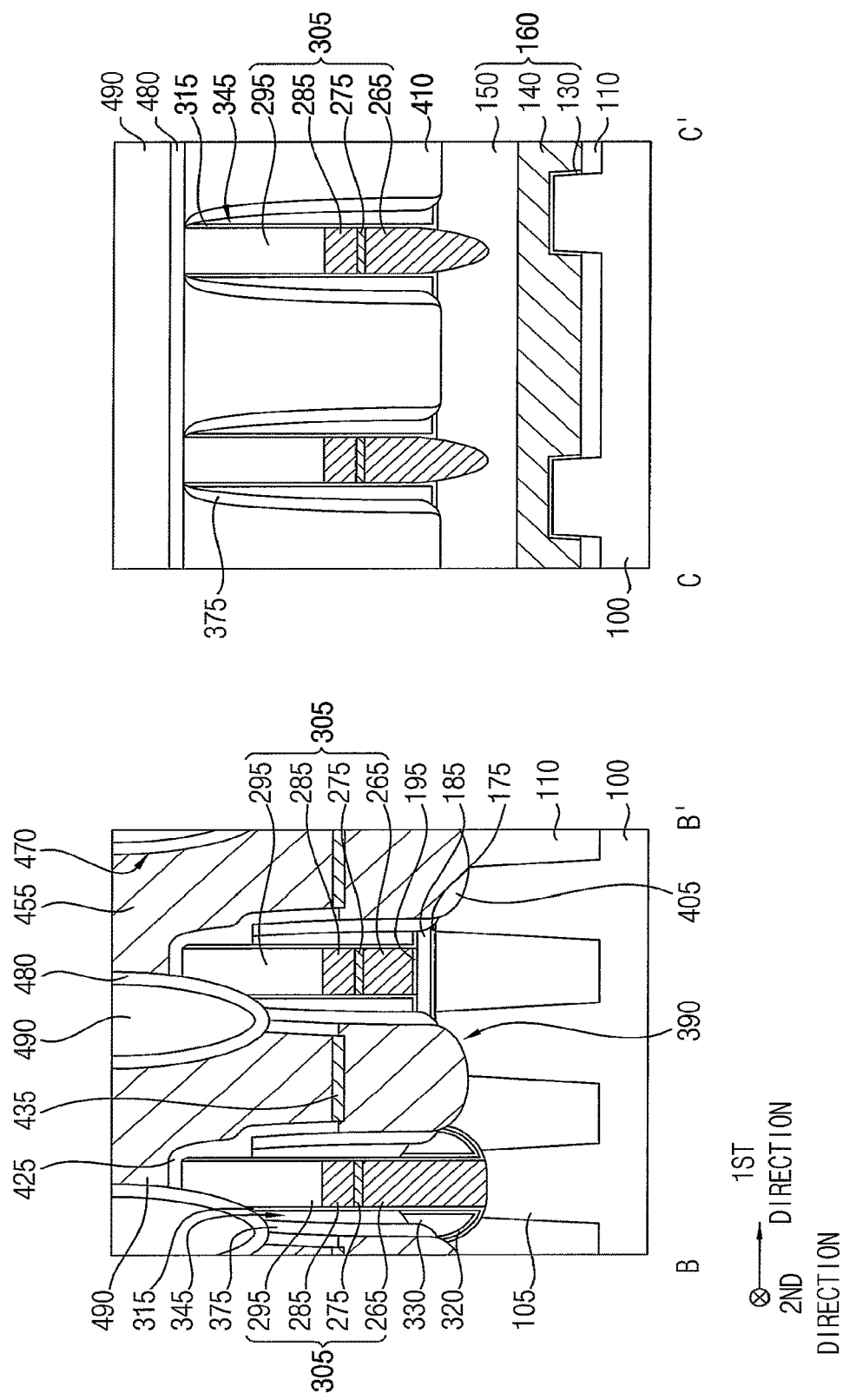

Referring to FIG. 31, upper portions of the upper contact plug layer 450, the first capping pattern 295, and the second, fourth, and fifth spacers 315, 375, and 425 may be removed to form a second hole 470, and thus an upper surface of the third spacer 340 may be exposed.

As the second hole 470 is formed, the upper contact plug layer 450 may be transformed into an upper contact plug 455. In example embodiments, a plurality of upper contact plugs 455 may be formed to be spaced apart from each other in each of the first and second directions, and may be arranged in a honeycomb pattern in a plan view. Each of the upper contact plugs 455 may have a shape of a circle, ellipse, or polygon in a plan view.

The lower contact plug 405, the metal silicide pattern 435 and the upper contact plug 455 sequentially stacked may form a contact plug structure.

The exposed third spacer 340 may be removed to form a second air gap 345 connected to the second hole 470. The third spacer 340 may be removed by, e.g., a wet etching process.

In example embodiments, not only a portion of the third spacer 340 on the sidewall of the bit line structure 305 extending in the second direction directly exposed by the second hole 470 but also other portions of the third spacer 340 parallel to the directly exposed portion thereof in the horizontal direction may be removed. For example, not only the portion of the third spacer 340 exposed by the second hole 470 not to be covered by the upper contact plug 455 but also a portion of the third spacer 340 adjacent to the exposed portion in the second direction to be covered by the second capping pattern 410 and a portion of the third spacer 340 adjacent to the exposed portion in the second direction to be covered by the upper contact plug 455 may be all removed.

First and second insulating interlayers 480 and 490 may be sequentially stacked to fill the second hole 470. The first and second insulating interlayers 480 and 490 may be also sequentially stacked on the second capping pattern 410.

The first insulating interlayer 480 may include a material having a low gap filling characteristic, and thus the second air gap 345 under the second hole 470 may not be filled. The second air gap 345 may be also referred to as an air spacer 345, and may form a spacer structure together with the second, fourth, and fifth spacers 315, 375, and 425. For example, the second air gap 345 may be a spacer including an air.

Figure 32:
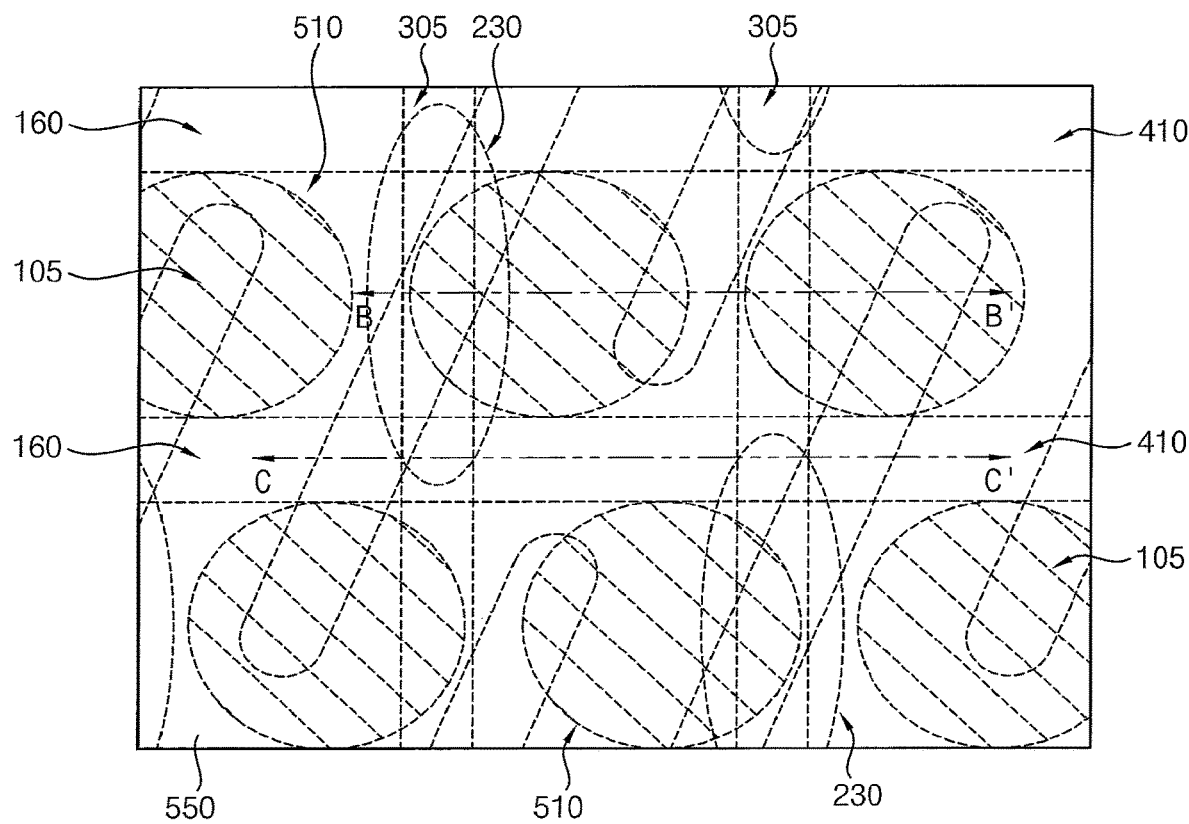
Figure 32:
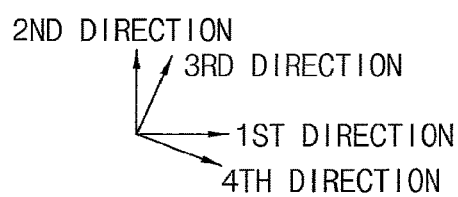
Figure 33:
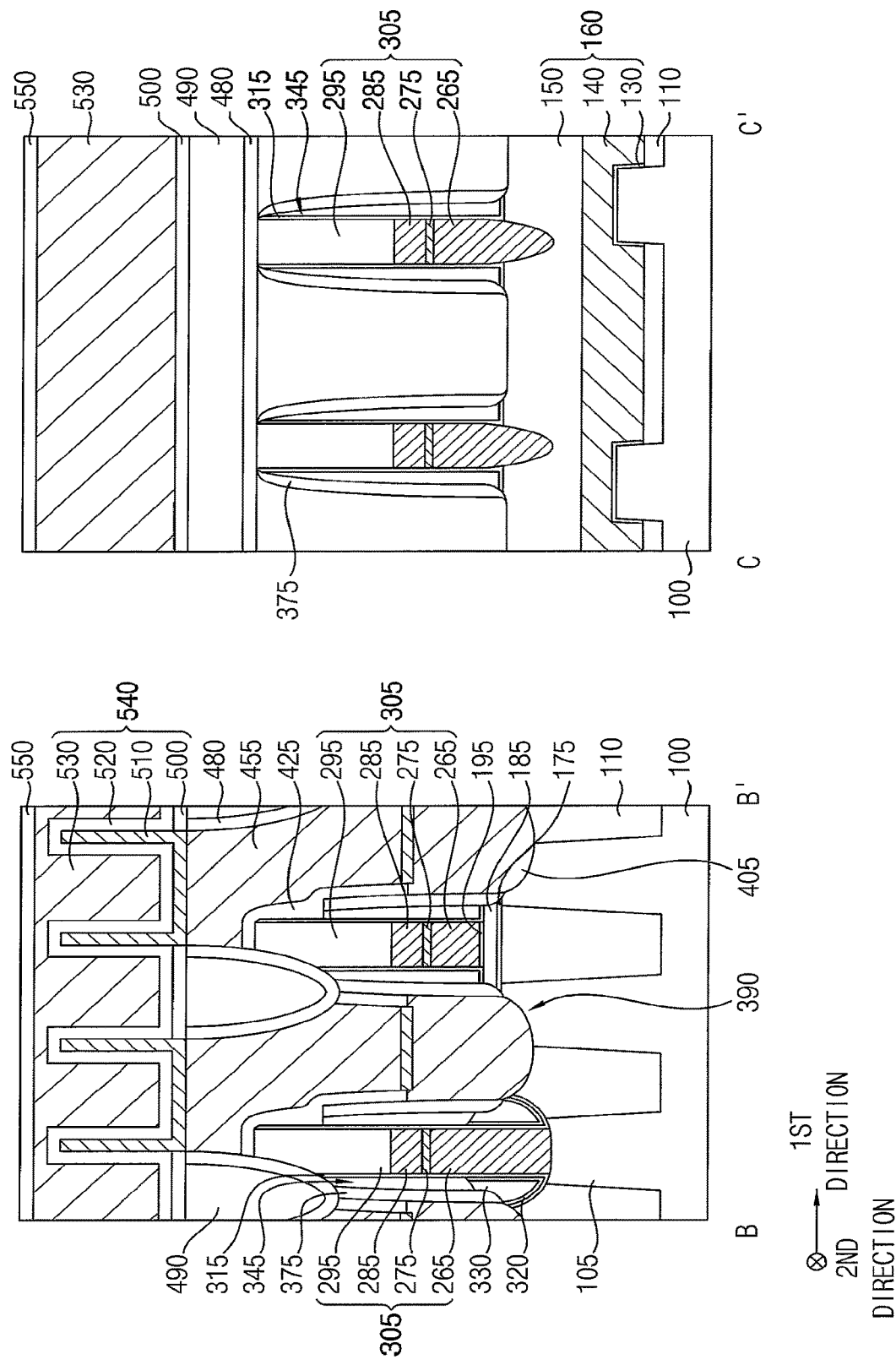

Referring to FIGS. 32 and 33, a capacitor 540 may be formed to contact the upper surface of the upper contact plug 455.

Particularly, an etch stop layer 500 and a mold layer (not shown) may be sequentially formed on the upper contact plug 455, and the first and second insulating interlayers 480 and 490, and partially etched to form a third hole partially exposing the upper surface of the upper contact plug 455.

A lower electrode layer (not shown) may be formed on a sidewall of the third hole, the exposed upper surface of the upper contact plug 455 and the mold layer, a second sacrificial layer (not shown) may be formed on the lower electrode layer to fill the third hole, and the lower electrode layer and the second sacrificial layer may be planarized until an upper surface of the mold layer may be exposed to divide the lower electrode layer. The second sacrificial layer and the mold layer may be removed by, e.g., a wet etching process, and thus a lower electrode 510 having a cylindrical shape may be formed on the exposed upper surface of the upper contact plug 455. Alternatively, the lower electrode 510 may have a pillar shape filling the sixth opening.

A dielectric layer 520 may be formed on a surface of the lower electrode 510 and the etch stop layer 500, and an upper electrode 530 may be formed on the dielectric layer 520 so that the capacitor 540 including the lower electrode 510, the dielectric layer 520 and the upper electrode 530 may be formed.

A third insulating interlayer 550 may be formed to cover the capacitor 540 on the substrate 100 to complete the fabrication of the semiconductor device. The third insulating interlayer 550 may include an oxide, e.g., silicon oxide.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of forming active patterns, the method comprising:
    forming a line structure on a substrate, the line structure extending in a first direction parallel to an upper surface of the substrate;
    forming a sacrificial layer on the substrate to cover the line structure;
    sequentially forming a first mask layer and a photoresist pattern on the sacrificial layer, the first mask layer including silicon oxynitride and the photoresist pattern including a first opening exposing an upper surface of the first mask layer;
    etching the first mask layer by an etching process using the photoresist pattern as an etching mask to form a first mask having a second opening exposing an upper surface of the sacrificial layer, the etching process using a first etching gas including $SF_6$ gas and $CHF_3$ gas so that carbon-sulfur (C—S) bonds are formed on a surface of the photoresist pattern to restrain etching of the photoresist pattern, and a slope of the second opening having an angle equal to or greater than 80 degrees with respect to the upper surface of the substrate;
    partially etching the sacrificial layer using the first mask as an etching mask to form a third opening exposing a portion of the line structure;
    removing the portion of the line structure exposed by the third opening to divide the line structure into a plurality of pieces spaced apart from each other in the first direction; and
    etching an upper portion of the substrate using the plurality of line structures as an etching mask to form a plurality of active patterns spaced apart from each other in the first direction.

2. The method according to claim 1, further comprising:
    prior to forming the line structure on the substrate, forming a first layer on the substrate,
    wherein etching the upper portion of the substrate using the plurality of line structures as the etching mask includes:
        etching the first layer using the plurality of line structures as an etching mask to form a plurality of first patterns spaced apart from each other in the first direction; and
        etching the upper portion of the substrate using the plurality of line structures and the plurality of first patterns as an etching mask.

3. The method according to claim 1, further comprising, prior to etching the first mask layer to form the first mask:
    forming a spacer layer on the upper surface of the first mask layer exposed by the first opening, a sidewall of the first opening and an upper surface of the photoresist pattern through an ALD process; and
    anisotropically etching the spacer layer to form a spacer on the sidewall of the first opening,
    wherein etching the first mask layer is performed using the photoresist pattern and the spacer as an etching mask.

4. The method according to claim 1, wherein the line structure includes a second pattern and a second mask sequentially stacked on the substrate, the second pattern and the second mask including polysilicon and an oxide, respectively.

5. The method according to claim 4, wherein dividing the line structure into the plurality of pieces spaced apart from each other includes:
    etching a portion of the second mask exposed by the third opening and an upper portion of the pattern thereunder using a second etching gas having no etching selectivity among the second pattern, the second mask, and the sacrificial layer to form a fourth opening; and
    removing a portion of the second pattern exposed by the fourth opening.

6. The method according to claim 5, wherein the second etching gas includes $CF_4$ gas and $CHF_3$ gas.

7. The method according to claim 1, wherein:
    the line structure is one of a plurality of line structures spaced apart from each other in a second direction parallel to the upper surface of the substrate and perpendicular to the first direction,
    the third opening is one of a plurality of third openings spaced apart from each other in the second direction, and each of the plurality of third openings partially exposes a corresponding one of the plurality of line structures, and the plurality of active patterns are spaced apart from each other in each of the first and second directions.

8. A method of manufacturing a semiconductor device, the method comprising:

forming a line structure on a substrate, the line structure extending in a first direction parallel to an upper surface of the substrate and including a pattern and a mask sequentially stacked, the pattern and the mask including different materials from each other;

forming a sacrificial layer on the substrate to cover the line structure;

partially etching the sacrificial layer to form a first opening partially overlapping the line structure in a vertical direction perpendicular to the upper surface of the substrate;

etching at least one of a portion of the mask, an upper portion of the pattern, and a portion of the sacrificial layer that are under the first opening using an etching gas to form a second opening, the etching gas having no etching selectivity among the pattern, the mask, and the sacrificial layer;

removing a lower portion of the pattern under the upper portion thereof to divide the pattern into a plurality of pieces spaced apart from each other in the first direction;

etching an upper portion of the substrate using the plurality of patterns as an etching mask to form a plurality of active patterns spaced apart from each other in the first direction;

forming a gate structure to be buried at upper portions of the plurality of active patterns;

forming a bit line structure on the plurality of active patterns to be electrically connected thereto; and forming a capacitor on the plurality of active patterns to be electrically connected thereto.

9. The method according to claim 8, wherein:

the line structure is one of a plurality of line structures spaced apart from each other in a second direction parallel to the upper surface of the substrate and perpendicular to the first direction, the first opening is one of a plurality of first openings spaced apart from each other in the second direction, and each of the plurality of first openings partially overlaps a corresponding one of the plurality of line structures, and the plurality of active patterns are spaced apart from each other in each of the first and second directions.

10. The method according to claim 9, wherein the gate structure extends in a third direction parallel to the upper surface of the substrate and has an acute angle with respect to the first and second directions, and the gate structure is one of a plurality of gate structures spaced apart from each other in a fourth direction parallel to the upper surface of the substrate and perpendicular to the third direction, and wherein the bit line structure extends in the fourth direction, and the bit line structure is one of a plurality of bit line structures spaced apart from each other in the third direction.

11. The method according to claim 10, wherein each of the plurality of bit line structures contacts an upper surface of a central portion in the first direction of a corresponding one of the plurality of active patterns, and wherein the capacitor is electrically connected to one of opposite ends in the first direction of a corresponding one of the plurality of active patterns.

12. The method according to claim 11, further comprising a contact plug structure electrically connecting the capacitor to the one of opposite ends in the first direction of the corresponding one of the plurality of active patterns.

13. A method of manufacturing a semiconductor device, the method comprising:

forming a line structure on a substrate, the line structure extending in a first direction parallel to an upper surface of the substrate;

forming a sacrificial layer on the substrate to cover the line structure;

sequentially forming a mask layer and a photoresist pattern on the sacrificial layer, the mask layer including silicon oxynitride and the photoresist pattern including a first opening exposing an upper surface of the mask layer;

etching the mask layer by an etching process using the photoresist pattern as an etching mask to form a mask having a second opening exposing an upper surface of the sacrificial layer, the etching process using an etching gas including $SF_6$ gas and $CHF_3$ gas so that carbon-sulfur (C—S) bonds are formed on a surface of the photoresist pattern to restrain etching of the photoresist pattern, and a slope of the second opening having an angle equal to or greater than 80 degrees with respect to the upper surface of the substrate;

partially etching the sacrificial layer using the mask as an etching mask to form a third opening exposing a portion of the line structure;

removing the portion of the line structure exposed by the third opening to divide the line structure into a plurality of pieces spaced apart from each other in the first direction;

etching an upper portion of the substrate using the plurality of line structures as an etching mask to form a plurality of active patterns spaced apart from each other in the first direction;

forming a gate structure to be buried at upper portions of the plurality of active patterns;

forming a bit line structure on the plurality of active patterns to be electrically connected thereto; and forming a capacitor on the plurality of active patterns to be electrically connected thereto.

14. The method according to claim 13, wherein:

the line structure is one of a plurality of line structures spaced apart from each other in a second direction parallel to the upper surface of the substrate and perpendicular to the first direction, the third opening is one of a plurality of third openings spaced apart from each other in the second direction, and each of the plurality of third openings partially exposes a corresponding one of the plurality of line structures, and the plurality of active patterns are spaced apart from each other in each of the first and second directions.

15. The method according to claim 14, wherein:

the gate structure extends in a third direction parallel to the upper surface of the substrate and having an acute angle with respect to the first and second directions, and the gate structure is one of a plurality of gate structures spaced apart from each other in a fourth direction parallel to the upper surface of the substrate and perpendicular to the third direction, the bit line structure extends in the fourth direction, the bit line structure is one of a plurality of bit line structures spaced apart from each other in the third direction, and each of the plurality of bit line structures contacts an upper surface of a central portion in the first direction of a corresponding one of the plurality of active patterns, and the capacitor is electrically connected to one of opposite ends in the first direction of a corresponding one of the plurality of active patterns.

* * * * *